(12) United States Patent
Maimon et al.

(10) Patent No.: US 6,589,714 B2
(45) Date of Patent: Jul. 8, 2003

(54) METHOD FOR MAKING PROGRAMMABLE RESISTANCE MEMORY ELEMENT USING SILYLATED PHOTORESIST

(75) Inventors: Jon Maimon, Manassas, VA (US); Andrew Pomerene, Leesburg, VA (US)

(73) Assignee: Ovonyx, Inc., Boise, ID (US)

( * ) Notice: Subject to any disclaimer, the term of this patent is extended or adjusted under 35 U.S.C. 154(b) by 82 days.

(21) Appl. No.: 09/891,551

(22) Filed: Jun. 26, 2001

(65) Prior Publication Data

US 2003/0039924 A1 Feb. 27, 2003

(51) Int. Cl.[7] .................................................. G02F 7/20
(52) U.S. Cl. ......................... 430/313; 430/318; 430/319
(58) Field of Search ................................. 430/313, 318, 430/319

(56) References Cited

U.S. PATENT DOCUMENTS

| | | | | |
|---|---|---|---|---|
| 6,136,661 A | * | 10/2000 | Yen et al. .................... | 438/396 |
| 2002/0036931 A1 | * | 3/2002 | Lowrey et al. ............. | 365/200 |
| 2002/0045323 A1 | * | 4/2002 | Lowrey et al. ............. | 438/382 |

* cited by examiner

*Primary Examiner*—John A. McPherson
(74) *Attorney, Agent, or Firm*—Philip H. Schlazer; Marvin S. Siskind

(57) ABSTRACT

A method of making a electrically operated programmable resistance memory element. A silylated photoresist sidewall spacer is used as a mask for form raised portions on an edge of a conductive layer. The modified conductive layer is used as an electrode for the memory element.

34 Claims, 28 Drawing Sheets

FIG - 2G"

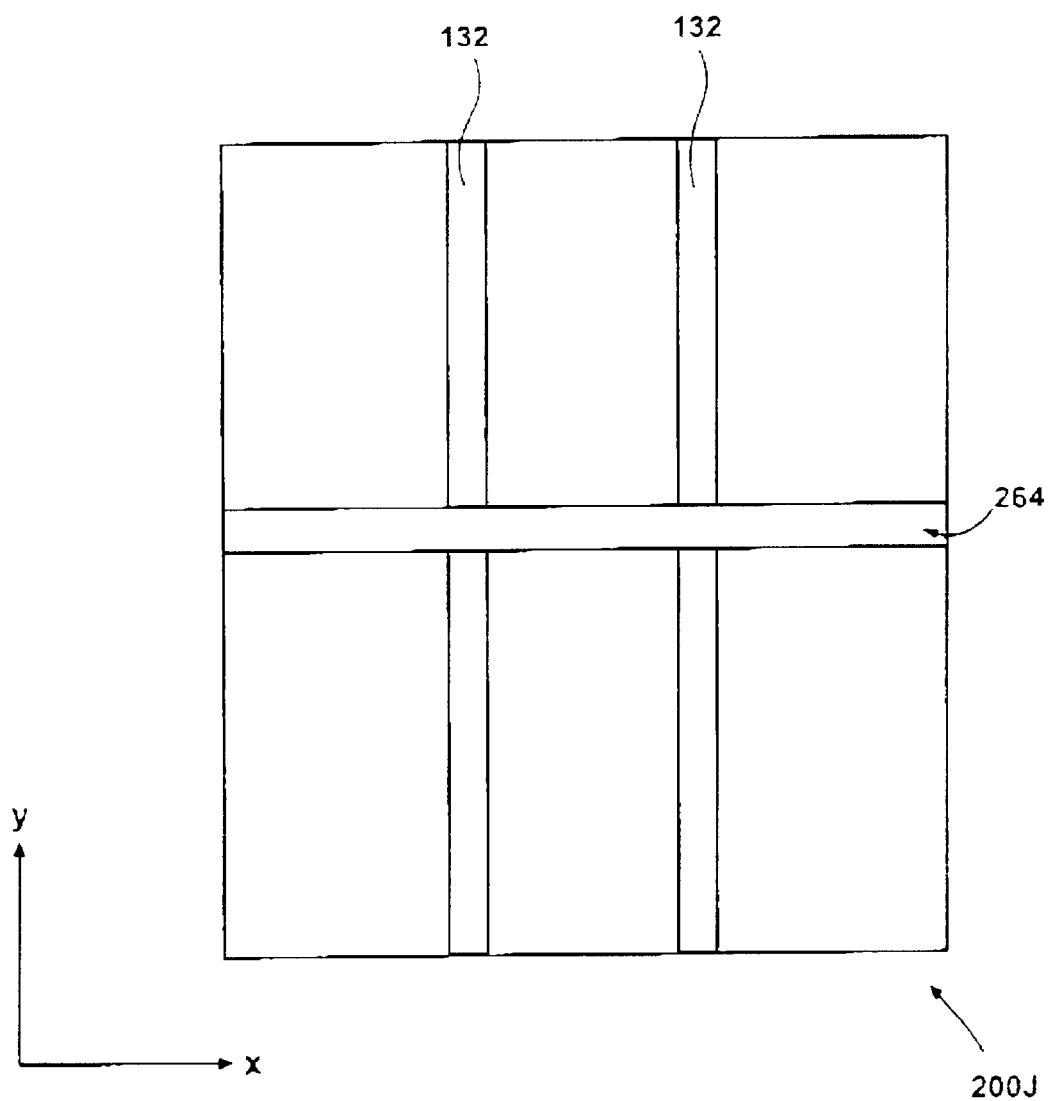
FIG - 2J"

FIG - 6F"
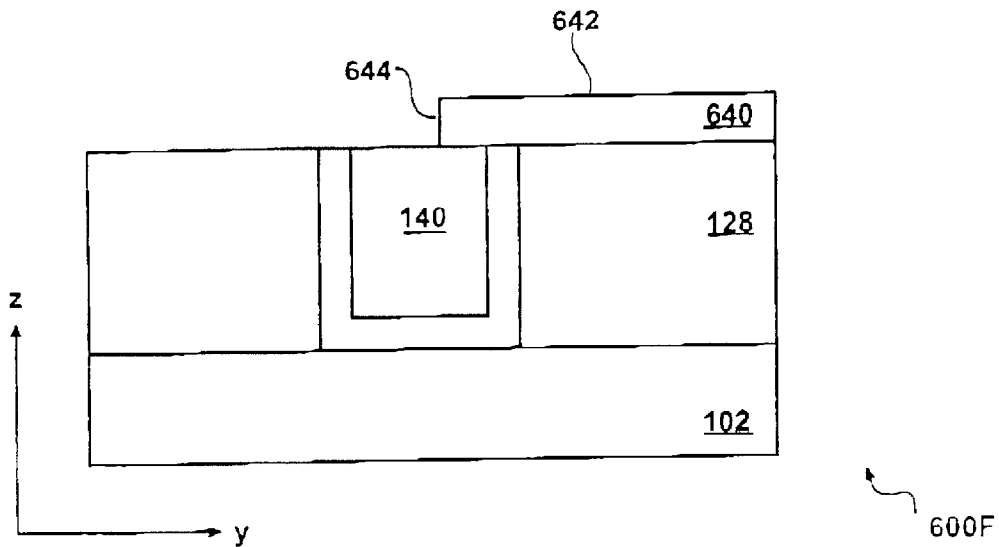
FIG - 6G
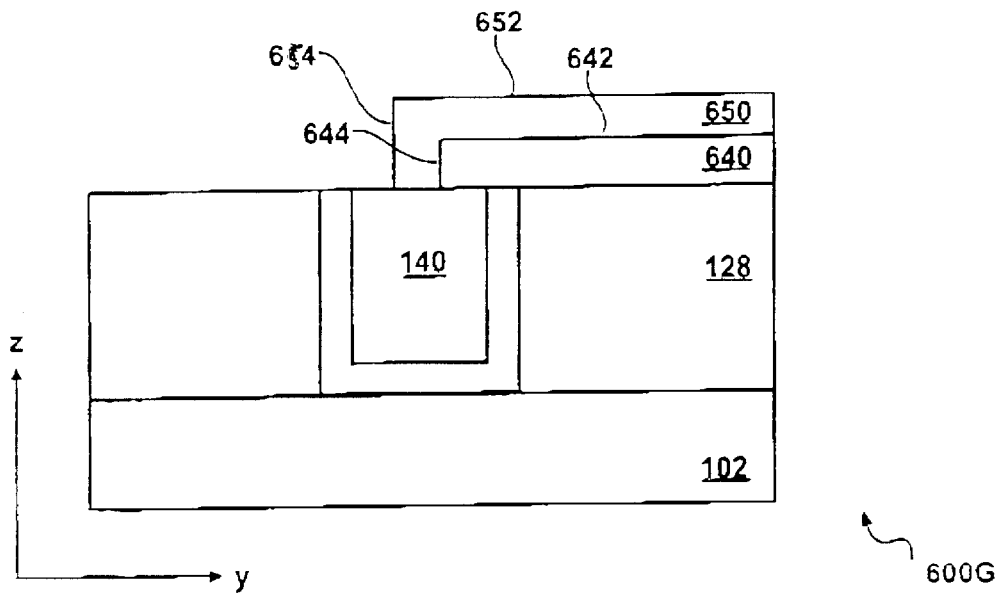

FIG - 6I"

METHOD FOR MAKING PROGRAMMABLE RESISTANCE MEMORY ELEMENT USING SILYLATED PHOTORESIST

FIELD OF THE INVENTION

The present invention relates generally to electrically operable memory elements. More specifically, the present invention relates to programmable resistance memory elements.

BACKGROUND OF THE INVENTION

Programmable resistance memory elements formed from materials that can be programmed to exhibit at least a high or low stable ohmic state are known in the art. Such programmable resistance elements may be programmed to a high resistance state to store, for example, a logic ONE data bit. As well, they may be programmed to a low resistance state to store, for example, a logic ZERO data bit.

One type of material that can be used as the memory material for programmable resistance elements is phase change material. Phase change materials may be programmed between a first structural state where the material is generally more amorphous (less ordered) and a second structural state where the material is generally more crystalline (more ordered). The term "amorphous", as used herein, refers to a condition which is relatively structurally less ordered or more disordered than a single crystal and has a detectable characteristic, such as high electrical resistivity. The term "crystalline", as used herein, refers to a condition which is relatively structurally more ordered than amorphous and has lower electrical resistivity than the amorphous state.

The concept of utilizing electrically programmable phase change materials for electronic memory applications is disclosed, for example, in U.S. Pat. Nos. 3,271,591 and 3,530,441, the contents of which are incorporated herein by reference. The early phase change materials described in the '591 and '441 Patents were based on changes in local structural order. The changes in structural order were typically accompanied by atomic migration of certain species within the material. Such atomic migration between the amorphous and crystalline states made programming energies relatively high.

The electrical energy required to produce a detectable change in resistance in these materials was typically in the range of about a microjoule. This amount of energy must be delivered to each of the memory elements in the solid state matrix of rows and columns of memory cells. Such high energy requirements translate into high current carrying requirements for the address lines and for the cell isolation/address device associated with each discrete memory element.

The high energy requirements for programming the memory cells described in the '591 and '441 patents limited the use of these cells as a direct and universal replacement for present computer memory applications, such as tape, floppy disks, magnetic or optical hard disk drives, solid state disk flash, DRAM, SRAM, and socket flash memory. In particular, low programming energy is important when the EEPROMs are used for large-scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the power consumption of the mechanical systems. In the case of lap-top computers, this is of particular interest because the mechanical hard disk drive is one of the largest power consumers therein. Therefore, it would be advantageous to reduce this power load, thereby substantially increasing the operating time of the computer per charge of the power cells. However, if the EEPROM replacement for hard drives has high programming energy requirements (and high power requirements), the power savings may be inconsequential or at best unsubstantial. Therefore, any EEPROM which is to be considered a universal memory requires low programming energy.

The programming energy requirements of a programmable resistance memory element may be reduced in different ways. For example, the programming energies may be reduced by the appropriate selection of the composition of the memory material. An example of a phase change material having reduced energy requirements is described in U.S. Pat. No. 5,166,758, the disclosure of which is incorporated by reference herein. Other examples of memory materials are provided in U.S. Pat. Nos. 5,296,716, 5,414,271, 5,359, 205, and 5,534,712 disclosures of which are all incorporated by reference herein.

The programming energy requirement may also be reduced through the appropriate modification of the electrical contacts used to deliver the programming energy to the memory material. For example, reduction in programming energy may be achieved by modifying the composition and/or shape and/or configuration (positioning relative to the memory material) of the electrical contacts. Examples of such "contact modification" are provided in U.S. Pat. Nos. 5,341,328, 5,406,509, 5,534,711, 5,536,947, 5,687,112, 5,933,365 all of which are incorporated by reference herein. Examples are also provided in U.S. patent application Ser. No. 09/276,273, the disclosure of which is incorporated herein by reference. Other examples are also provided in U.S. patent application Ser. No. 09/620,318, the disclosure of which is incorporated herein by reference. Yet other examples are provided in U.S. patent application Ser. No. 09/677,957 the disclosure of which is incorporated herein by reference. Still other examples are provided in U.S. patent application Ser. No. 09/813,267, the disclosure of which is incorporated herein by reference. The present invention is directed to novel structures of a programmable resistance memory element and methods for making these structures.

SUMMARY OF THE INVENTION

One aspect of the present invention is a method for making a programmable resistance element, comprising: providing a conductive material; forming a silylated photoresist sidewall spacer over a portion of the conductive material; removing a portion of the conductive material to form a raised portion extending from the conductive material under the spacer; and forming a programmable resistance material adjacent to at least a portion of the raised portion.

Another aspect of the invention is a method for making a programmable resistance element, comprising: providing a conductive layer; forming a silylated photoresist sidewall spacer over a portion of an edge of the conductive layer; removing a portion of the conductive layer to form a raised portion extending from the edge under the spacer; and forming a programmable resistance material adjacent to at least a portion of the raised portion.

Another aspect of the invention is A method of forming a programmable resistance memory element, comprising: providing a first dielectric layer; forming a sidewall surface in the first dielectric layer; forming a conductive layer on the sidewall surface; forming a second dielectric layer over the conductive layer; forming or exposing an edge of the conductive layer; forming a silylated photoresist sidewall spacer over a portion of the edge of the conductive layer; forming a raised portion extending from the edge of the conductive layer; and forming a programmable resistance memory material adjacent to at least a portion of the raised portion.

BRIEF DESCRIPTION OF THE DRAWINGS

FIGS. 6A–6M' is an embodiment of a process for making a memory element shown in FIG. 5D;

DETAILED DESCRIPTION OF THE INVENTION

The present invention is directed to programmable resistance memory elements. The memory element comprises a volume of memory material which is programmable between a first resistance state and a second resistance state in response to an electrical signal. The memory element further comprises a means of delivering the electrical signal to the volume of memory material. Preferably, the means of delivering the electrical signal comprises a first and a second electrical contact, also referred to as first and second electrodes, which are in electrical communication with the volume of memory material. The electrical contacts or electrodes do not have to be in physical contact with the memory material. (It is noted, that as used herein, the terminology "electrical contacts" and "electrodes" are synonymous and may be used interchangeably).

Figure 1A:
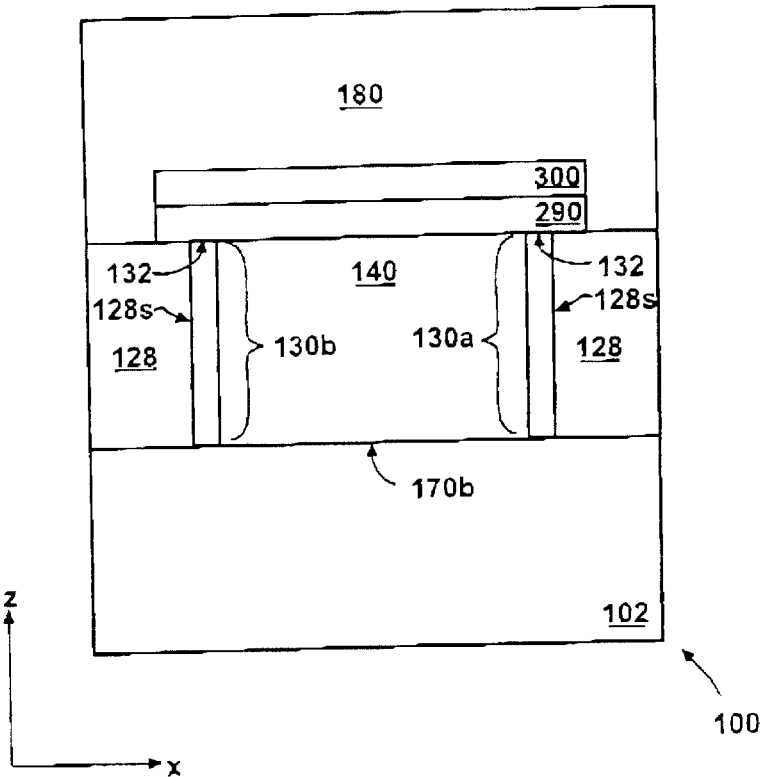
FIG. 1A is a cross sectional view of a memory device comprising conductive sidewall spacers as electrical contacts.

FIG. 1A is an cross-sectional view (parallel to the x-z plane) of a memory device 100 formed on a semiconductor substrate 102. In the example shown, the memory device 100 comprises two independent memory elements. The first memory element comprises a first electrical contact 130A (a bottom electrode), a layer of memory material 290 and a second electrical contact 300 (a top electrode). The second memory element comprises a first electrical contact 130B (a bottom electrode), a layer of memory material 290 and a second electrical contact 300 (a top electrode).

In the example shown, the volume of memory material is a substantially horizontally disposed layer of memory material 290. The memory material 290 and the second electrical contact 300 are shared by the first and second memory elements. However, other embodiments are possible where each memory element has a separate volume (or layer) of memory material and a separate second electrical contact. Dielectric regions 140 and 128 may be formed of silicon dioxide. Region 140 electrically isolates the bottom electrical contact 130A from the bottom electrical contact 130B. An upper dielectric region 180 is deposited on top of the memory device 100. The upper dielectric layer 180 may comprise boron-phosphate silica glass (BPSG). Reference to the electrical contact 130A,B refers to either electrical contact 130A or electrical contact 130B.

Each of the electrical contacts 130A and 130B shown in FIG. 1A is a conductive layer. More specifically, each is a conductive sidewall layer in the form of a conductive sidewall spacer. A conductive sidewall layer may be formed by the substantial conformal deposition of a conductive material onto a sidewall surface. In FIG. 1A, sidewall surfaces 128S and bottom surface 170B form a trench extending perpendicular to the plane of the illustration.

In the example shown in FIG. 1A, each conductive spacer 130A,B is "edgewise adjacent" to the memory material. That is, only edge 132 or a portion of edge 132 of conductive spacer 130A,B is adjacent to the memory material 290. The remainder of the conductive spacer is remote to the memory material. Hence, substantially all electrical communication between the conductive spacer 130A,B and the memory material 290 occurs through all or a portion of edge 132. It is noted that edge 132 does not have to be in actually physical contact with the memory material. Also, in an alternate configuration it is possible to position the layer 290 of memory material so that it is adjacent to an edge of only one of the conductive spacers.

Figure 1B:
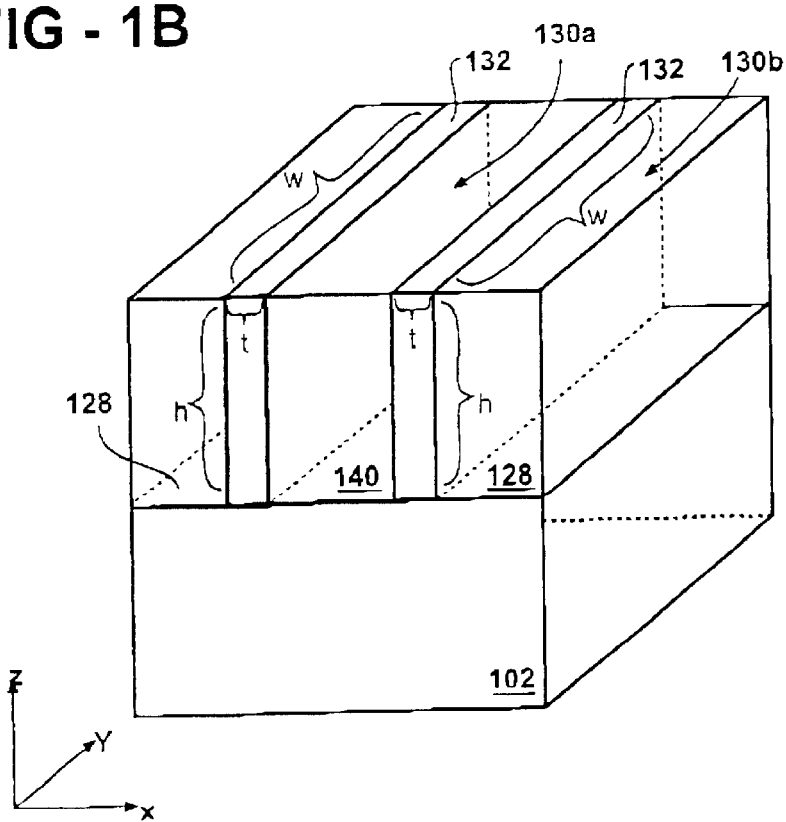
FIG. 1B is a three-dimensional view of the conductive sidewall spacers shown in FIG. 1A.

FIG. 1B is an idealized three-dimensional representation of conductive spacers 130A,B showing their thickness "t" (lateral distance parallel to the substrate in the x-z plane), width "w" (lateral distance parallel to the substrate in the y-z plane) and height "h" (distance above the substrate). The thickness "t" and width "w" may each have dimensions smaller than what is producible by conventional photolithography.

As used herein the "area of contact" is the portion of the surface of an electrical contact through which the electrical contact electrically communicates with the memory material. While not wishing to be bound by theory it is believed that reducing the size of the area of contact reduces the volume of the memory material programmed, thereby reducing the total current needed to program the memory device. As noted, in the embodiment shown in FIG. 1A, substantially all electrical communication between the memory material 290 and conductive sidewall spacer 130A,B occurs through all or a portion of edge 132. Hence, the area of contact between the conductive spacer 130A,B and the memory material 290 is an edge of the conductive sidewall spacer or a portion of an edge of the conductive sidewall spacer. The area of contact is thus very small and is proportional to the thickness of the conductive spacer adjacent to the memory material.

Figure 1C:
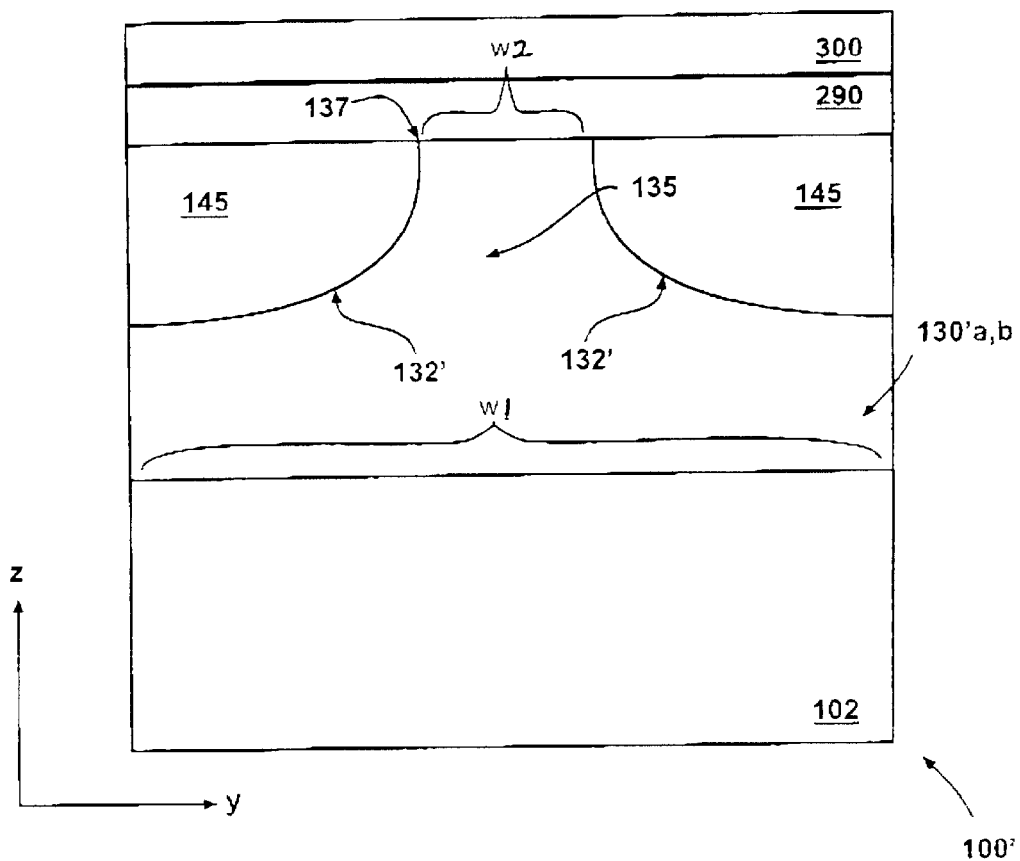
FIG. 1C is a cross-sectional view of a memory element using conductive sidewall spacers with raised portions.
Figure 1D:
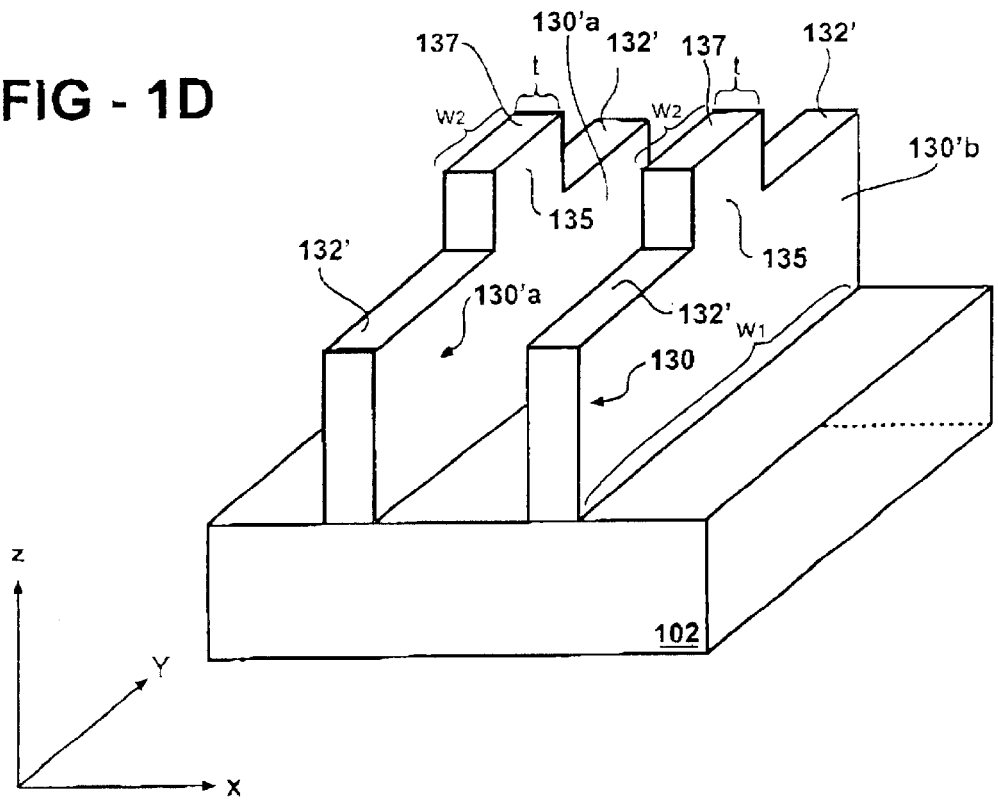
FIG. 1D is a three-dimensional view of conductive sidewall spacers with a raised portion.

The area of contact may be reduced even further. In FIGS. 1A and 1B, each conductive sidewall layer 130A,B has a substantially uniform width "w" (dimension along the y-axis). In order to further decrease the area of contact between each conductive sidewall spacer 130A,B and the memory material, each conductive sidewall spacer may be formed so that its width is reduced (i.e., the conductive spacer is made narrower) adjacent to the memory material. Reducing the width "w" of the sidewall spacer adjacent the memory material reduces the area of contact between the conductive spacer and the memory material. This embodiment, referred to as a "rapier" design of the conductive spacer, is shown in FIG. 1C. FIG. 1C is a cross-sectional view (parallel to the y-z plane) of a memory device 100' using a conductive sidewall spacer 130'A,B with a rapier design. As shown, the top edge 132 of the conductive sidewall spacer has been appropriately etched so that its width is reduced adjacent to the memory material. In particular, each conductive spacer has been appropriately recessed to form a protrusion or raised portion 135 adjacent to the memory material. The raised portion 135 extends from the recessed edge 132' to an upper (or distal) end or top surface 137 adjacent the memory material 290. The top surface 137 of the raised portion 135 is also referred to as the "tip" or "peak" of the raised portion. FIG. 1D is a three-dimensional representation of the conductive layers 130'A,B having raised portions 135 that extend from the edges 132'. The top surface or tip 137 of each of the raised portions has a thickness "t" and a width "w2". The thickness "t" is the thickness of the conductive layer 130'A,B adjacent to the memory material (not shown). Preferably, thickness "t" is less than about 750 Angstroms, more preferably less than about 500 Angstroms and most preferably less than about 300 Angstroms. The width "w2" of the raised portion 135 adjacent the memory material is substantially less than the width "w1" of the sidewall layer 130'A,B adjacent the substrate 102. Preferably, the width "w2" is less than 700 Angstroms, more preferably less than 600 Angstroms and most preferably less than about 500 Angstroms. The thickness "t", the width "w2" as well as the surface area of the tip 137 may all be made smaller than what is permitted by photolithographic techniques. Preferably, the dimensions of the top surface 137 are sufficient so that the area of contact between the raised portion 135 and the memory material is preferably less than about 0.005 micron$^2$, more preferably less than about 0.0025 micron$^2$, and most preferably less than about 0.0015 micron$^2$.

The raised portion 135 may be made to have substantially vertical sidewalls (for example, substantially uniform width "w2" and substantially uniform thickness "t"), or it may be made to taper as it extends toward the tip 137 (for example, by tapering the width "w2 and/or by tapering the thickness "t"). Generally, the shape of the raised portion 137 is not limited to any particular shape. Examples of possible shapes include conical, pyramidal, prismatic and wedge-shaped frustums. The top surface or tip 137 of the raised portion 135 may be substantially flat or rounded. It is also conceivable that the top end or tip 137 may also be sharpened. The height of the raised portion 135 as well as the extent of any tapering may be controlled.

Referring again to FIG. 1C, a dielectric material 145 is preferably positioned between the conductive sidewall layer 130'A,B and the memory material so that only the top surface 137 (or a portion of the top surface 137) is exposed and in electrical contact with the memory material. Hence, substantially all electrical communication between each conductive layer 130'A,B and the memory material occurs through all or a portion of the top surface or tip 137 of the raised portion 135. The area of contact between each bottom electrode 130'A,B and the memory material is thus preferably the top surface or tip 137. As noted above, in one embodiment of the invention it is preferable that the area of contact has an area less than about 0.005 micron$^2$, more preferably less than about 0.0025 micron$^2$, and most preferably less than about 0.0015 micron$^2$.

In an alternate embodiment of the invention, it is possible that the raised portion 135 be made to protrude into the memory material so that more of the surface of the raised portion 135 is in electrical contact with the memory material. It is noted that more than one raised portion may be formed on the edge 132' of each conductive layer 130'A,B.

As explained in more detail below, the raised portions 135 may be made by forming a silylated photoresist spacer over the conductive sidewall layers 130A,B shown in FIG. 1B. Specifically, the spacer is positioned above the conductive sidewall layers 130A,B where it is desired to position the raised portions 135. The spacer serves as a mask for either an anisotropic or isotropic etch. That is, the exposed sections of the edges 132 of the sidewall layers will be etched away and recessed while the section underlying the mask is protected from the etch so as to form raised portions or protrusions that extend from the recessed edges.

Figure 2A:
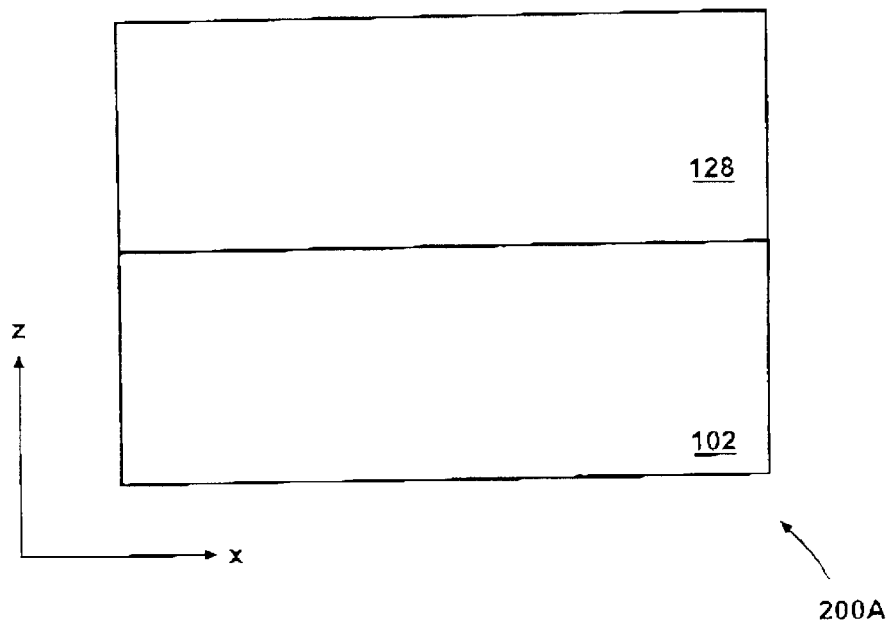
FIGS. 2A–2N shows a process for making a memory element with raised portions.
Figure 2B:
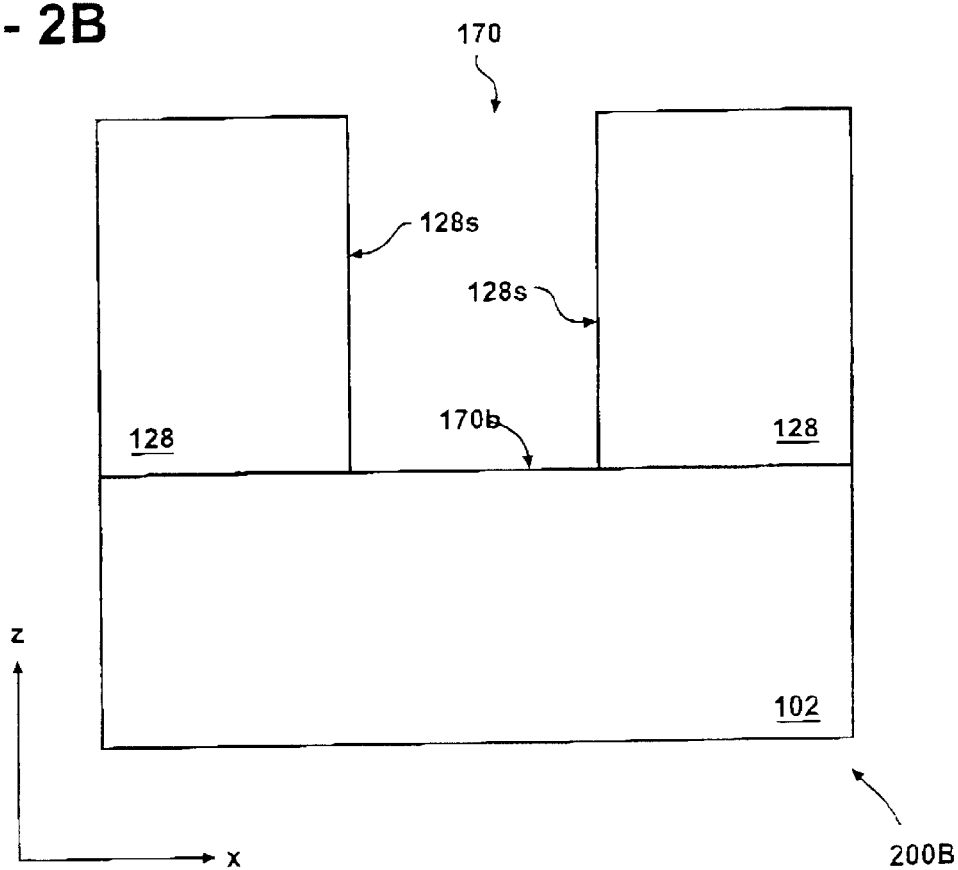
Figure 2C:
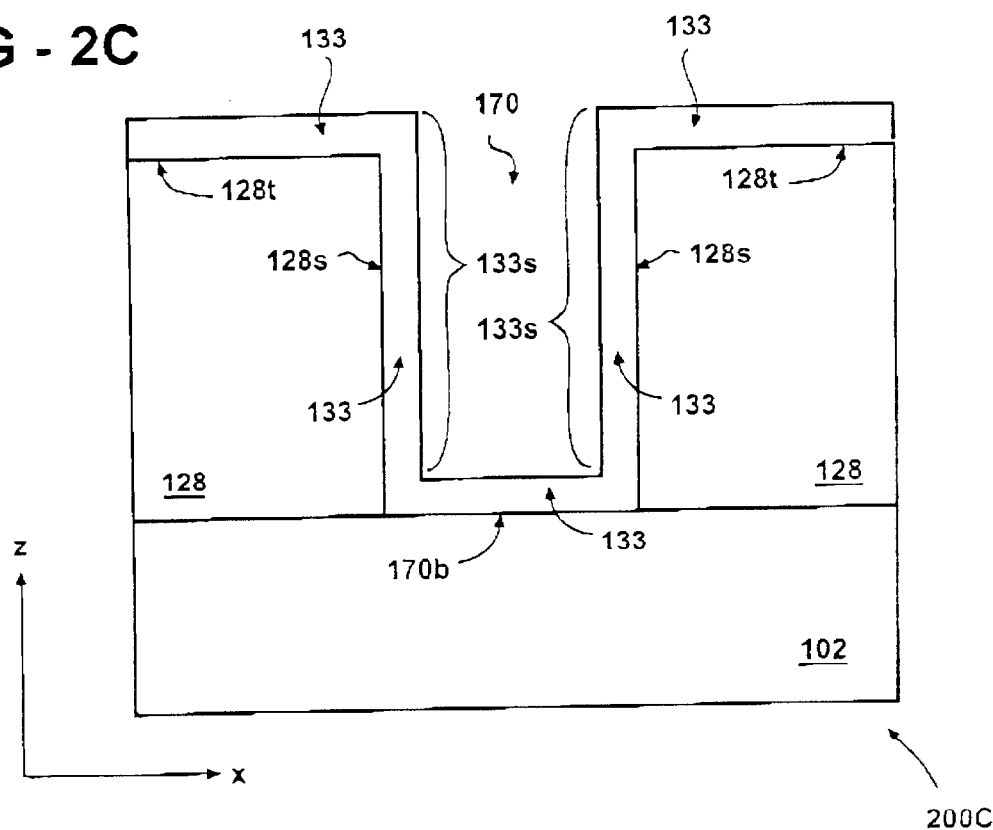
Figure 2D:
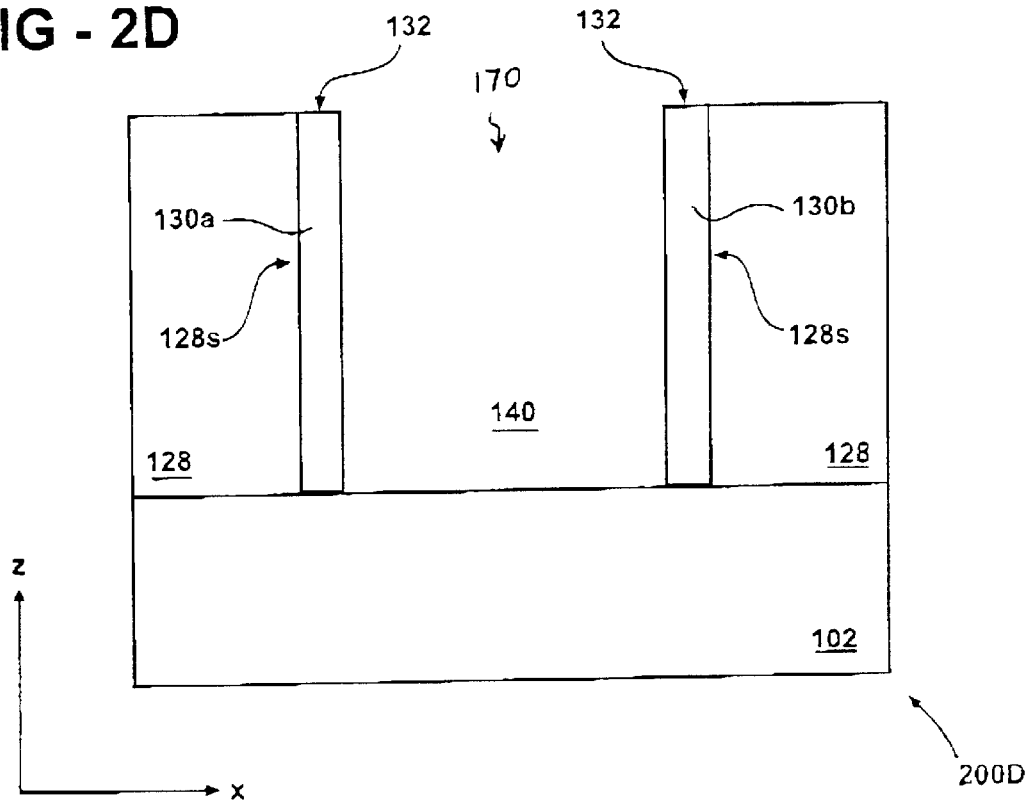
Figure 2E:
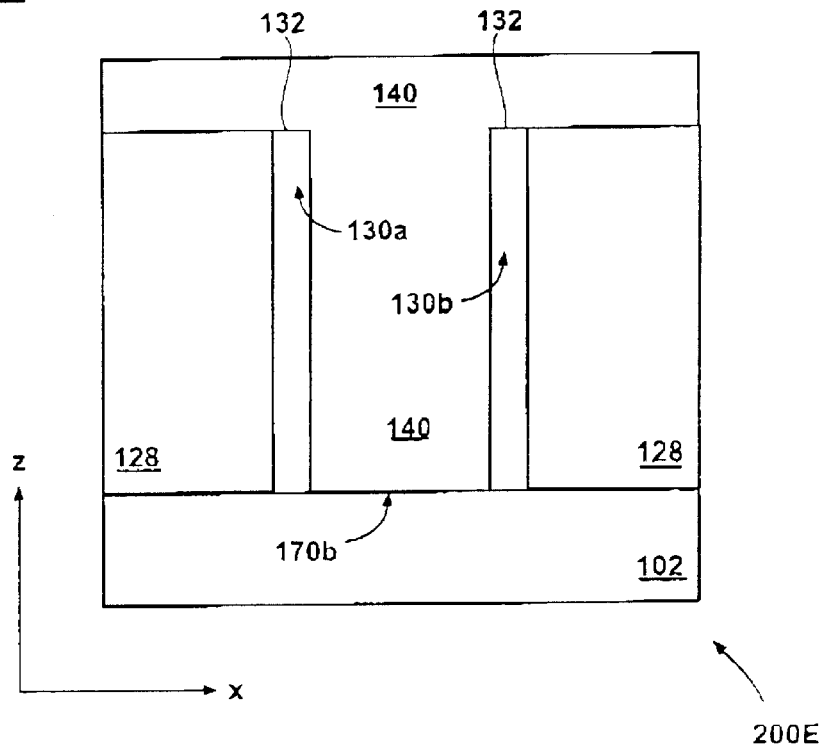
Figure 2F:
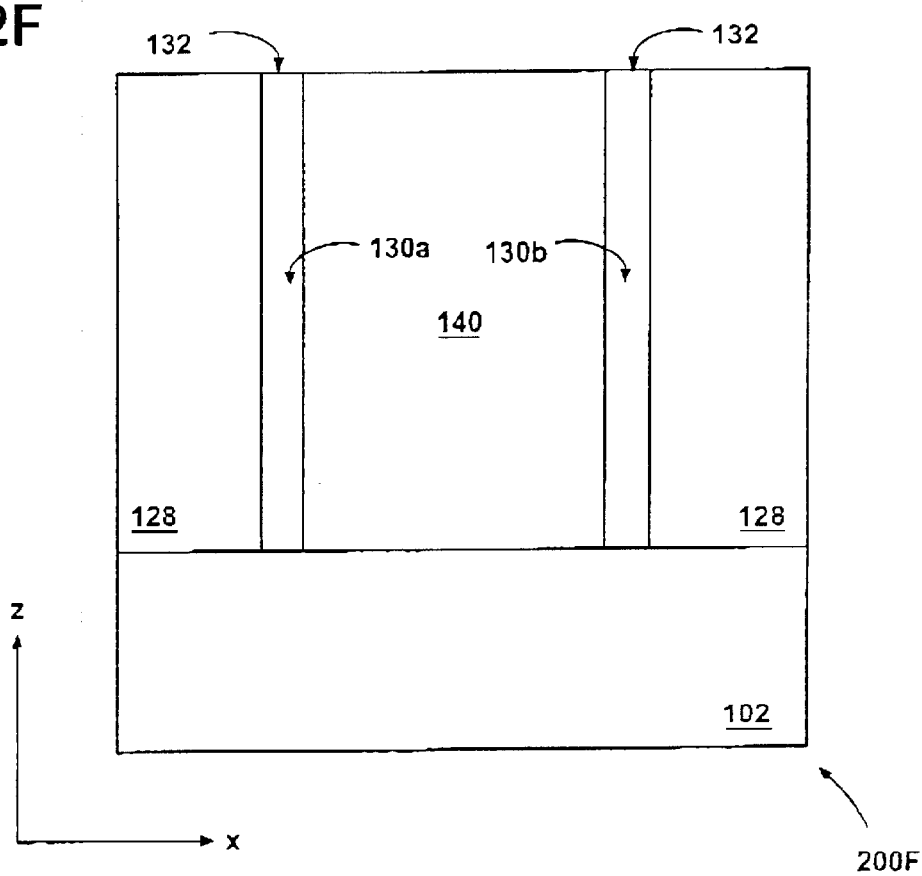
Figure 2F:
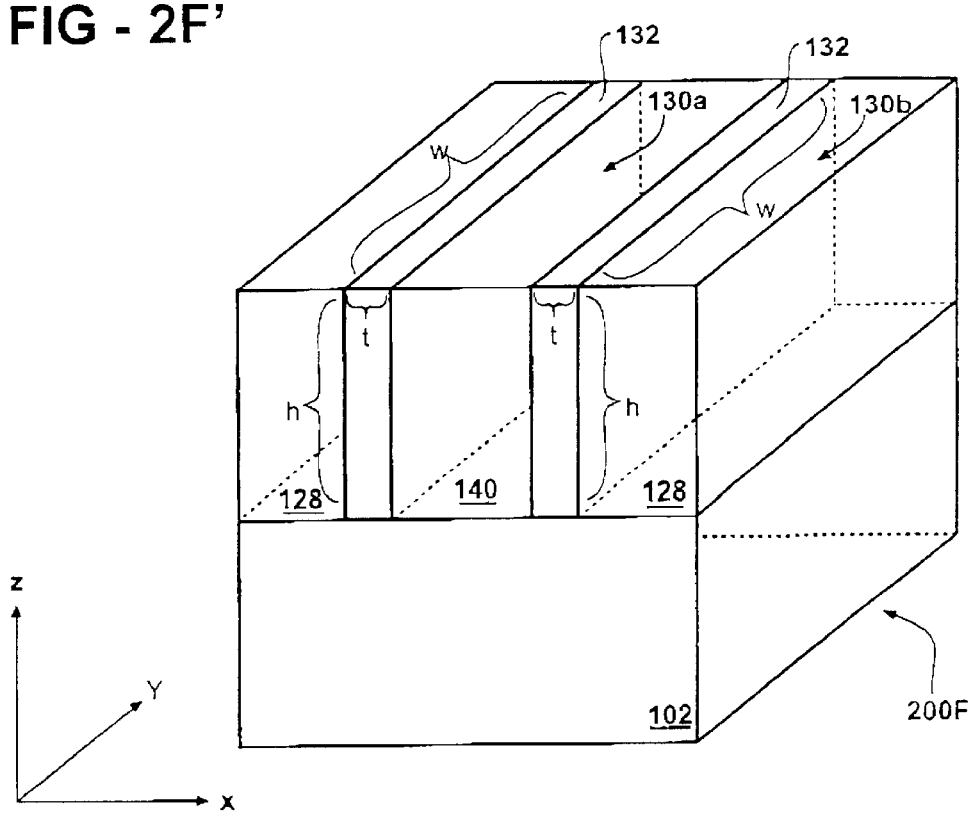
Figure 2G:
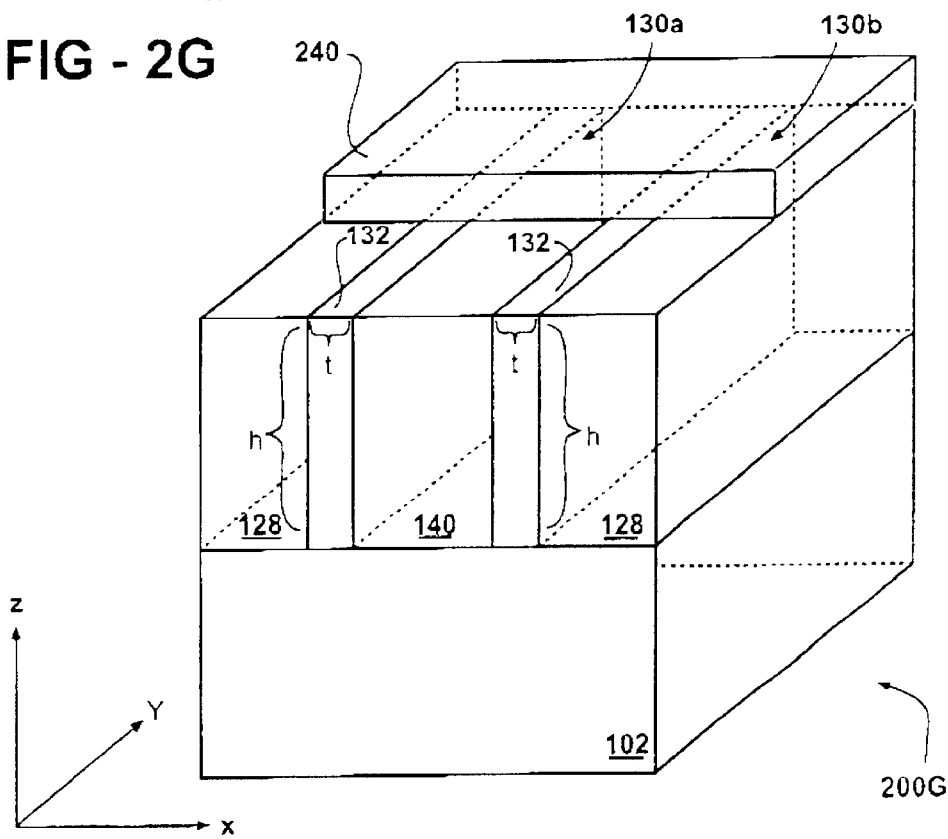
Figure 2G:
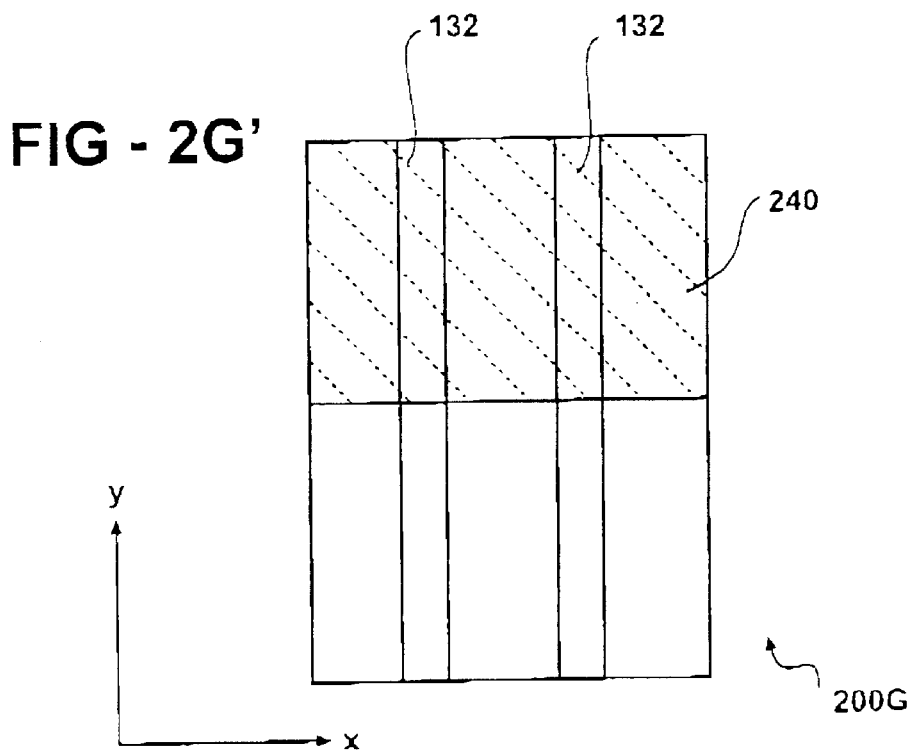
Figure 2G:
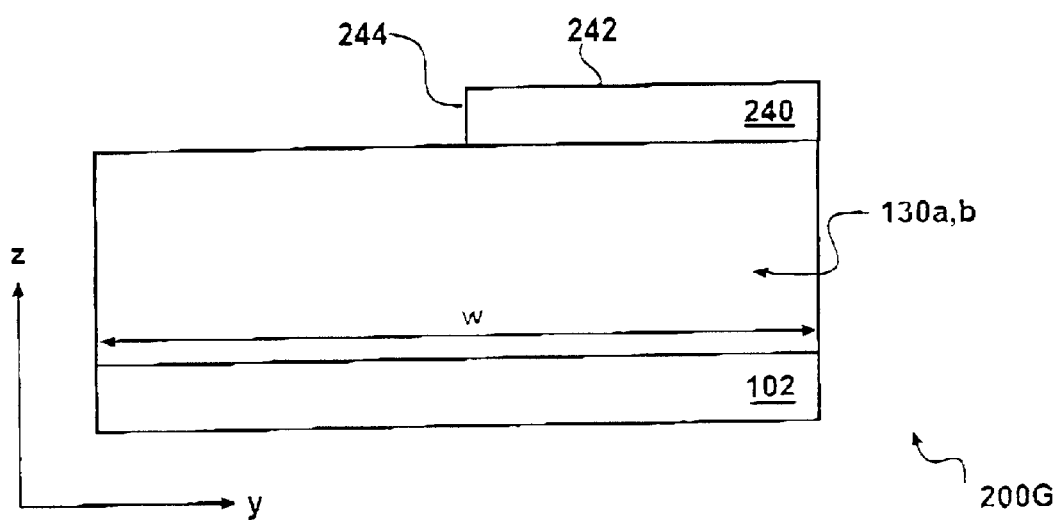
Figure 2H:
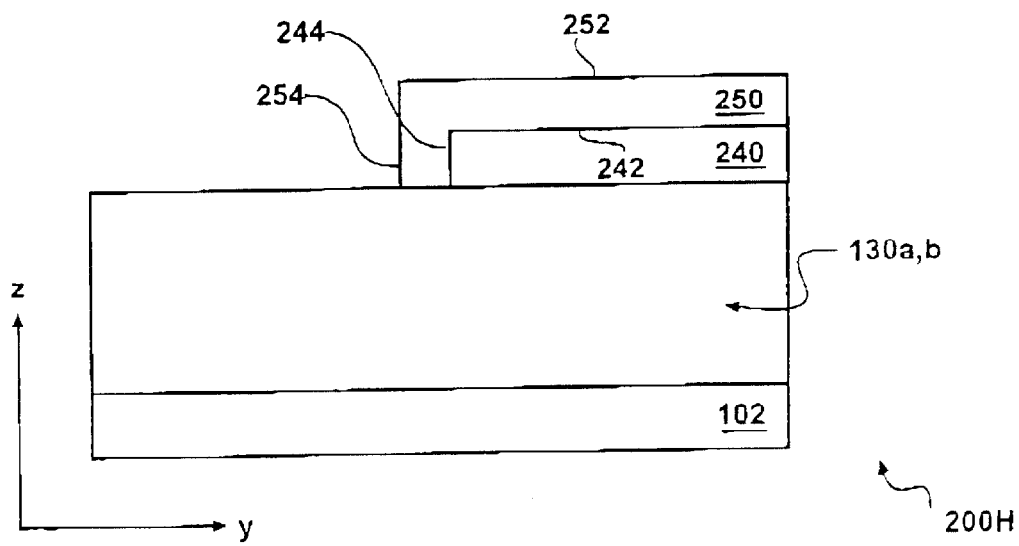
Figure 2I:
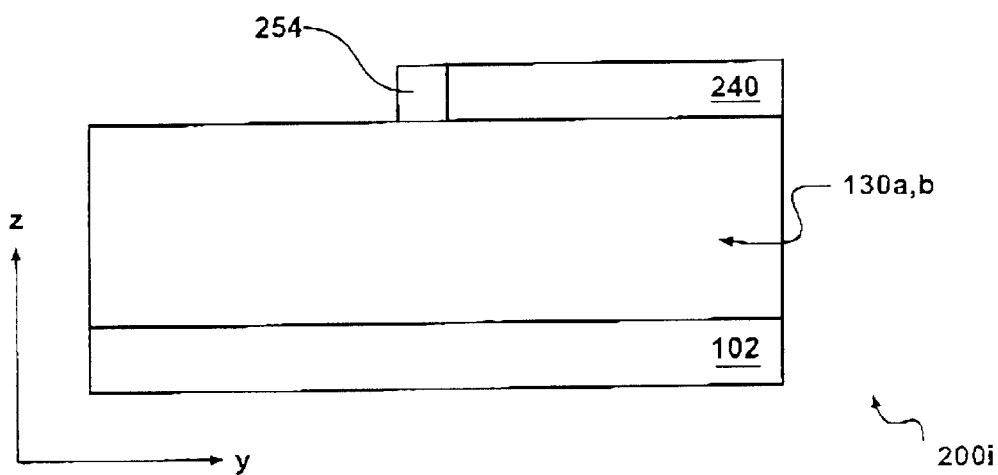
Figure 2J:
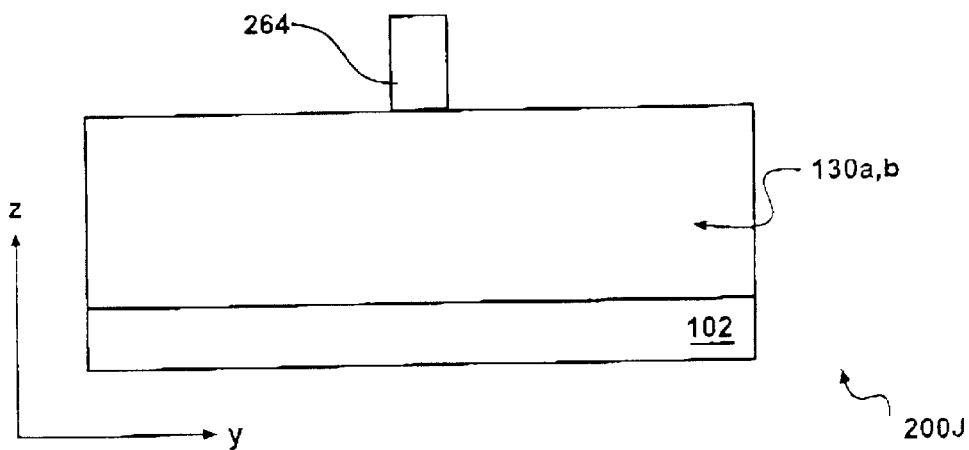
Figure 2J:
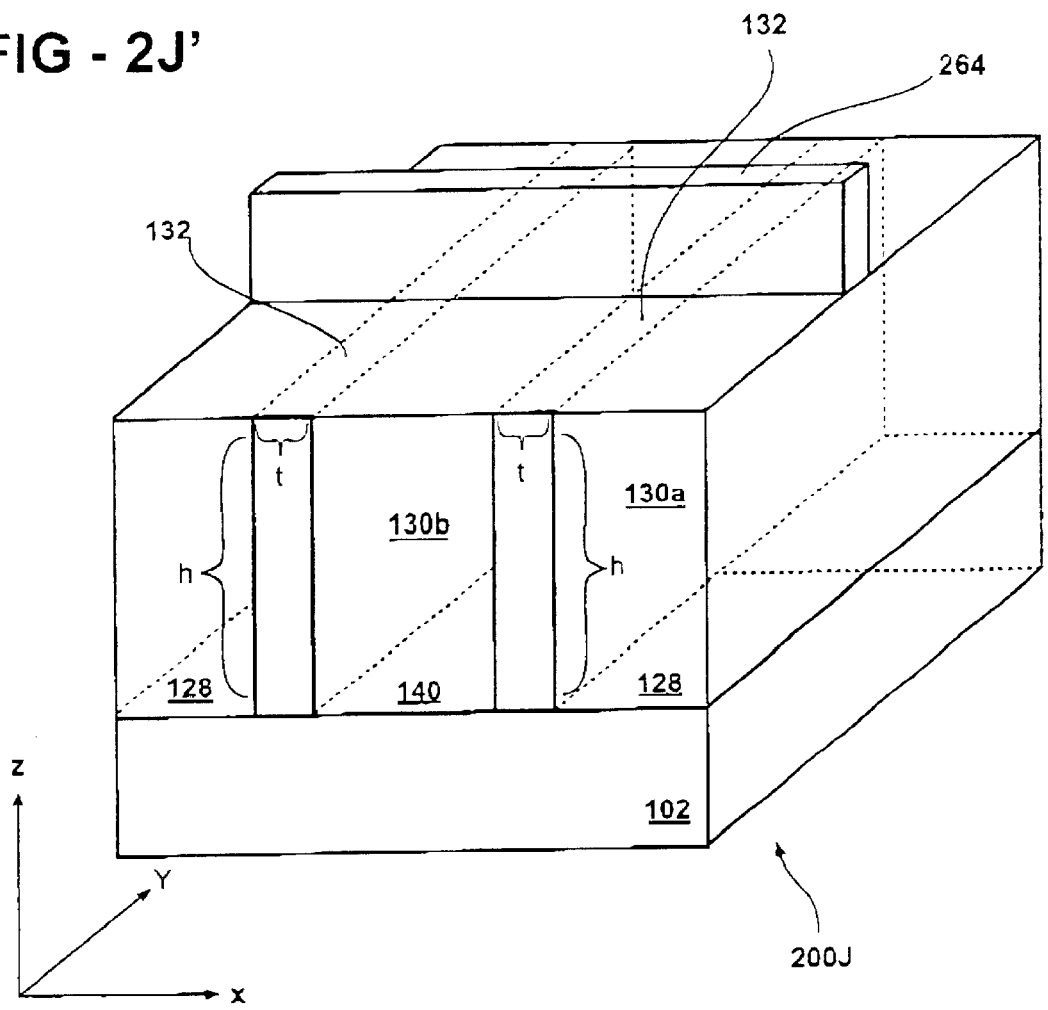
Figure 2K:
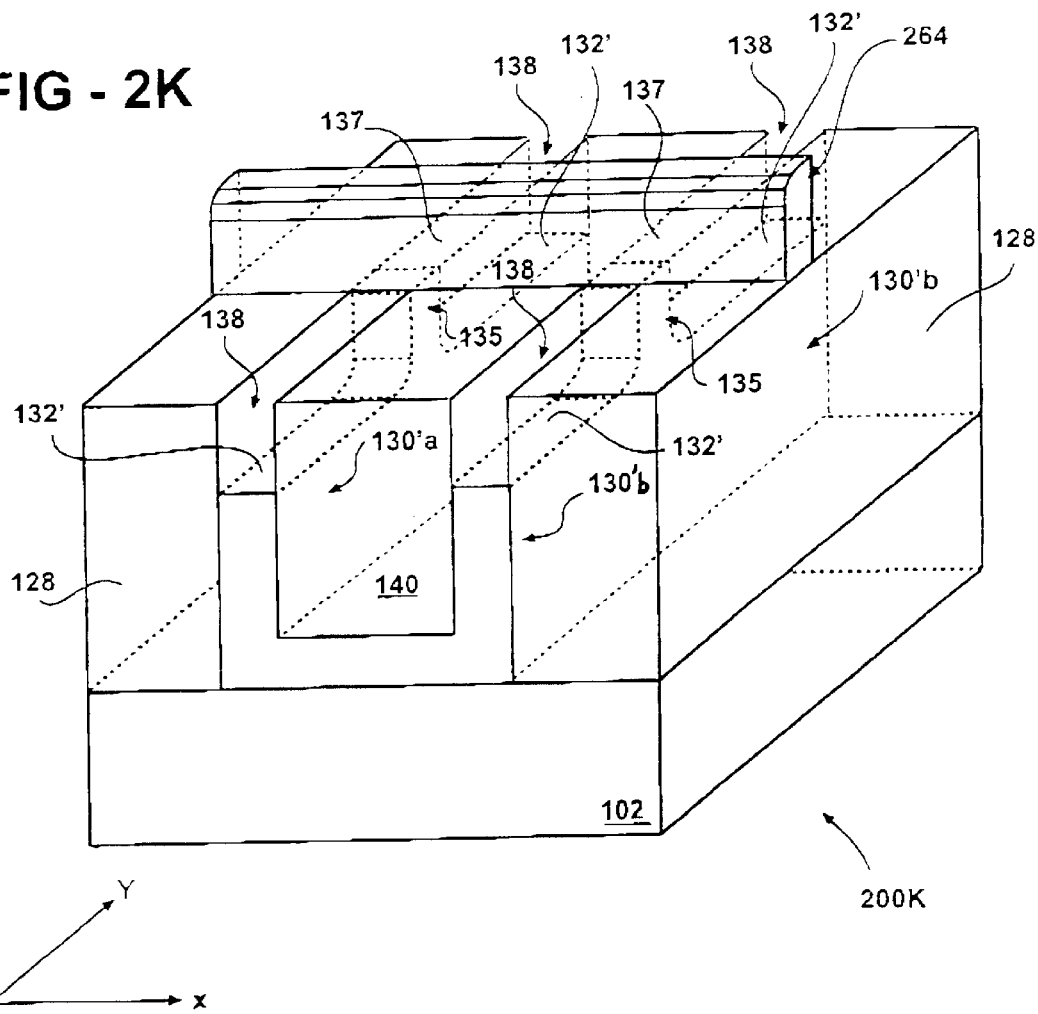
Figure 2K:
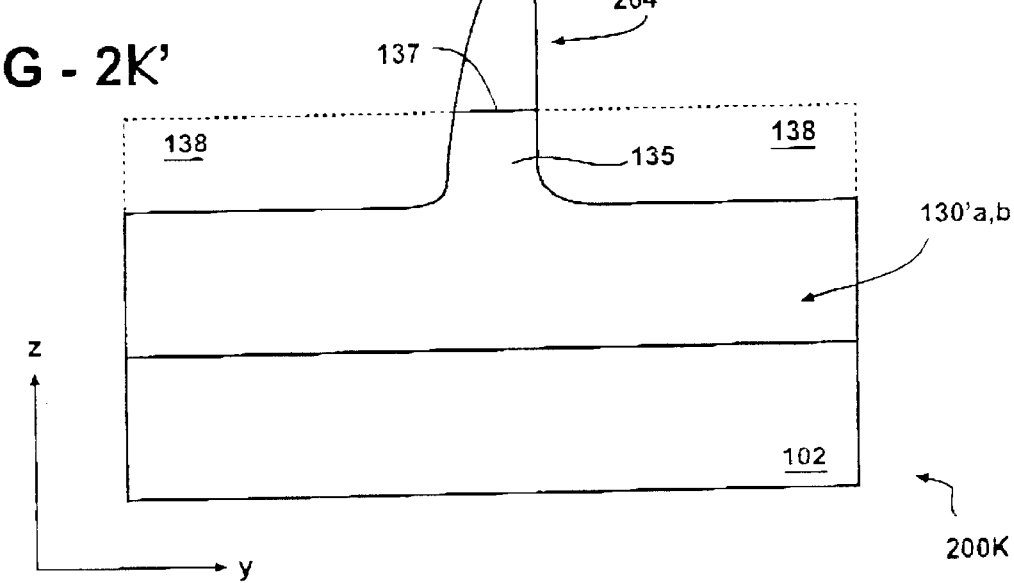
Figure 2L:
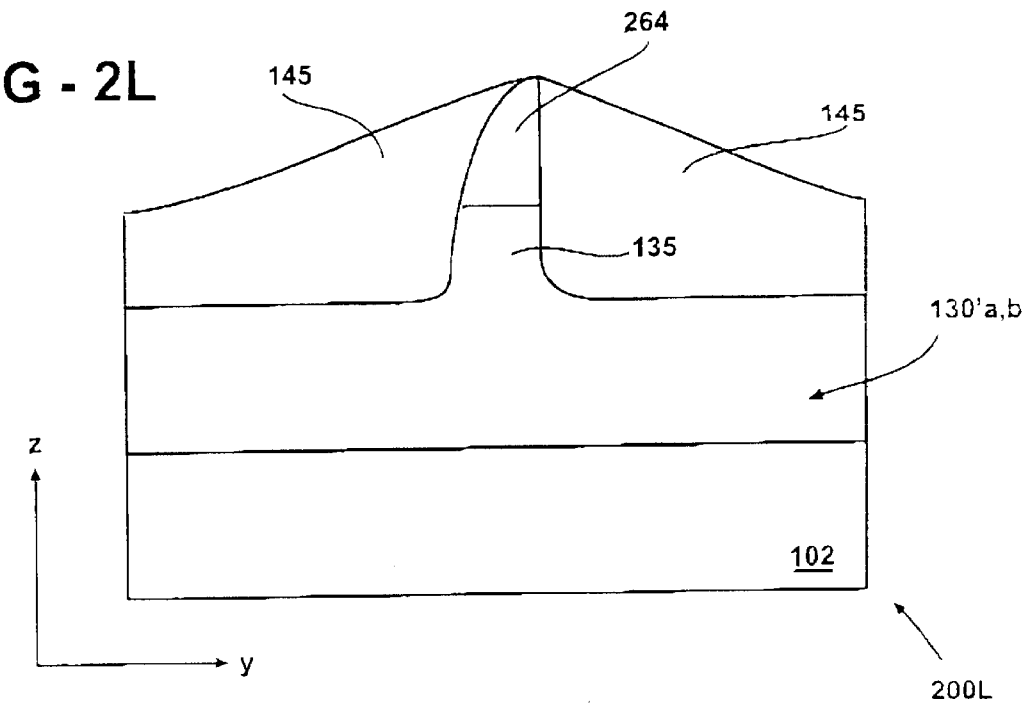
Figure 2M:
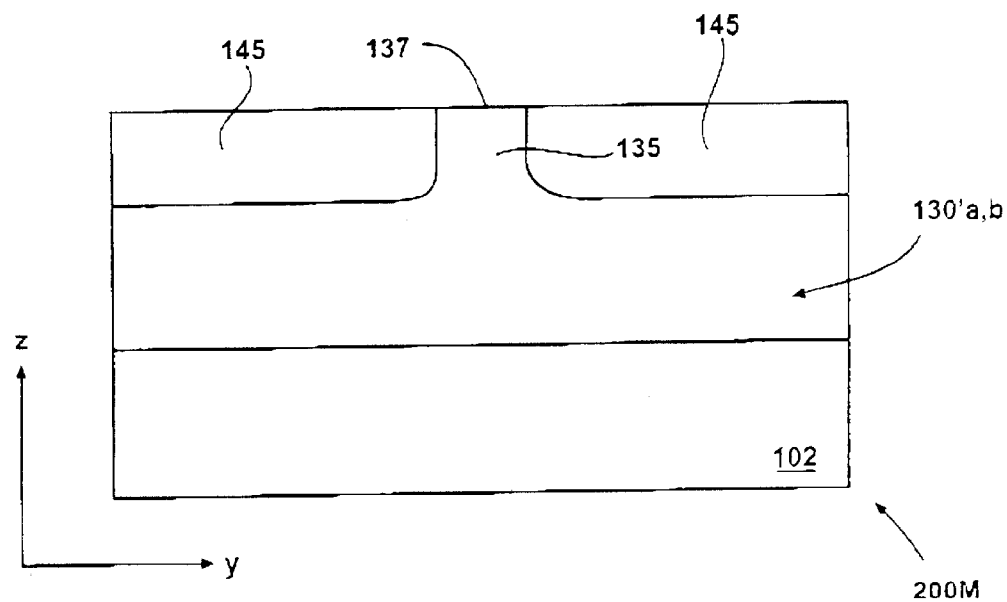
Figure 2N:
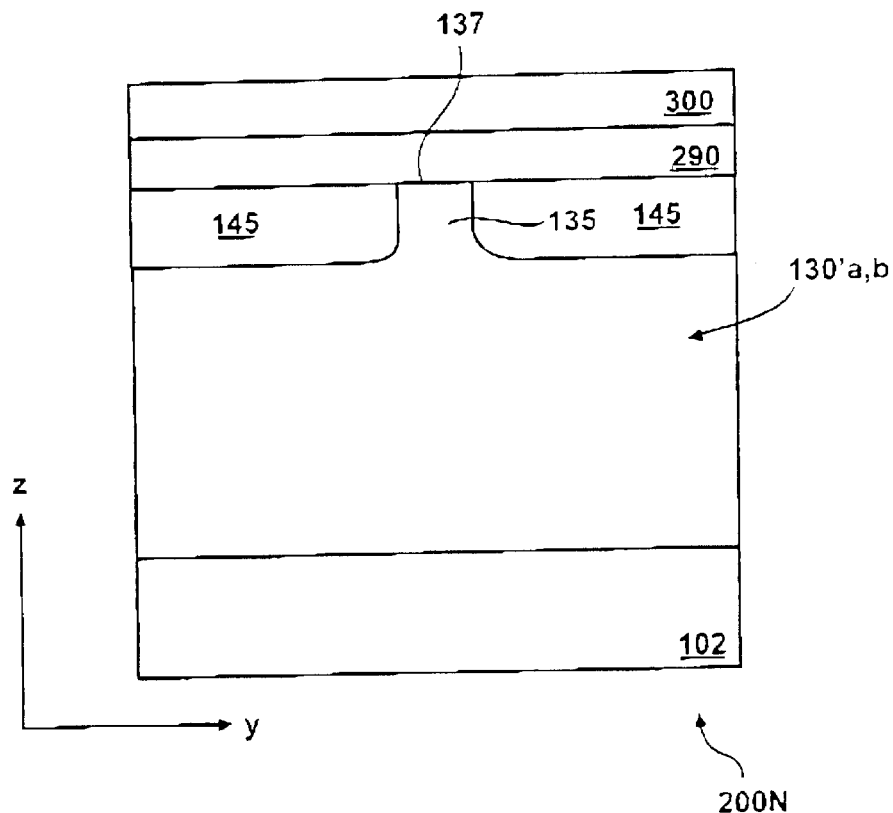

An embodiment of a method for fabricating the memory device 100' of FIG. 1C is shown in FIGS. 2A–2N. Referring first to FIG. 2A, a substrate 102 is provided and a dielectric layer 128 is deposited on top of the substrate 102 to form the structure 200A shown in FIG. 2A. The dielectric layer 128 may be a dielectric material such as silicon dioxide $SiO_2$ which may be deposited by means such as chemical vapor deposition (CVD).

Referring to FIG. 2B, the dielectric layer 128 is then appropriately masked and etched to form a window or opening in the dielectric layer 128 that exposes the substrate. The opening may, for example, be in the form of a circular opening, a rectangular opening or a trench. In the embodiment shown in structure 200B, the opening is a trench 170 which runs perpendicular to the plane of the illustration. The trench 170 has sidewall surfaces 128S (corresponding to the sidewall surfaces of the dielectric regions 128) and bottom surface 170B.

A layer 133 of a conductive material is deposited onto the structure 200B to form the structure 200C shown in FIG. 2C. Preferably, the deposition is a substantially conformal deposition. The layer 133 is deposited onto the top surfaces 128T of the dielectric regions 128, onto the sidewall surfaces 128S of the dielectric regions 128, and onto the bottom surface 170B of the trench 170. Hence, portions of the layer 133 are deposited along the two sidewall surfaces 128S of the trench 170. These portions of the layer 133 are sidewall layer portions 133S of the layer 133. The conformal deposition of layer 133 may be done using chemical vapor deposition techniques. Other possible deposition methods may be used as long as the sidewall surfaces 128S are appropriately covered by the layer 133.

Generally, the material 133 may be any conductive material. For example, the conductive material may be a metal, a metal alloy, or a doped polysilicon. Examples of materials which may be used for layer 133 are include, but are not limited to, n-type doped polysilicon, p-type doped polysilicon, p-type doped silicon carbon alloys and/or compounds, n-type doped silicon carbon alloys and/or compounds, titanium-tungstem, tungsten, tungsten silicide, molybdenum, and titanium nitride. Other examples include titanium carbon-nitride, titanium aluminum-nitride, titanium silicon-nitride, and carbon.

The n-type polysilicon may be formed "in situ" by depositing polysilicon in the trench 170 using a CVD process in the presence of phosphene. Alternately, the n-type polysilicon may be formed by first depositing polysilicon and then doping the polysilicon with phosphorous or arsenic. P-type doped polysilicon may be formed by first depositing polysilicon and then doping the polysilicon with boron.

The layer 133 may have a thickness which is preferably between about 50 and about 1000 Angstroms, and more preferably between about 100 and about 500 Angstroms.

After the layer 133 is conformally deposited it is then anisotropically etched. The anisotropic etch removes those sections of the layer 133 which are substantially horizontally disposed and leaves those sections which are substantially vertically disposed. Specifically, the anisotropic etch removes the substantially horizontally disposed sections of the layer 133 that were deposited on top surfaces 128T of the regions 128. It also removes the substantially horizontally disposed section of the layer 133 deposited onto the bottom surface 170B of trench 170. The anisotropic etch leaves those sections of the layer 133 conformally deposited along the sidewall surfaces 128S. Hence, the anisotropic etch leaves the sidewall layer portions 133S of the layer 133. The results of the anisotropic etch are shown as structure 200D in FIG. 2D. The sidewall layer portions 133S of layer 133 form the conductive sidewall spacers 130A,B having the top edges 132.

The conductive sidewall spacers 130A,B shown in FIG. 2D extend continuously along the "y" dimension, perpendicular to the plane of the illustration of FIG. 2D. The next step in the process is to mask and etch the conductive sidewall spacers 130A,B so as to form a plurality of individual conductive sidewall spacers along the "y" dimension of the array. These conductive spacers define individual memory elements along the "y" dimension of array.

The opening 170 is then filled with a dielectric material such as silicon dioxide $SiO_2$. This may be done by depositing the dielectric material 140 onto the trench 170 and on top of the dielectric layers 128 of structure 200D to form structure 200E that is shown in FIG. 2E. (The dielectric material is deposited onto the bottom surface 170B as well as onto the sidewall layers 130A,B). The deposition may be done using a chemical vapor deposition process. The structure 200E may then chemically mechanically polished (CMP) or dry etched to form the structure 200F shown in FIG. 2F. The chemical mechanical polishing or dry etching preferably planarizes the top surfaces of the sidewall layers 130A,B to expose at least a portion of one or both of the edges 132 of the sidewall spacers 130A,B (as shown in FIG. 2F). An idealized three-dimensional representation of the structure 200F is shown in FIG. 2F'.

A photoresist layer is applied onto the top surface of structure 200F. The photoresist material is deposited onto the edges 132. A portion of the photoresist layer is removed (that is, the photoresist layer is patterned) and the remaining portion of the photoresist layer forms the photoresist mask 240 overlying at portion of the edges 132 as shown as structure 200G in FIG. 2G. A top view of the photoresist mask 240 relative to the top edges of the conductive layers 130A,B is shown in FIG. 2G'. A cross-sectional view of structure 200G (in the y-z plane) is shown in FIG. 2G". As noted in FIG. 2G", the photoresist mask 240 has a top surface 242 as well as a sidewall surface 244.

Referring to FIG. 2H, the photoresist mask 240 is silylated. Silylation is the diffusion of silicon into the photoresist material. During silylation, the photoresist is heated in an atmosphere containing a silylation agent. In one embodiment, the photoresist is preferably heated in an atmosphere of between about 50° C. and 70° C. for a time period which is preferably between about 2 and about 10 minutes. Typical silylation agents include dimethylsilydimthylamine(DMSDMA), dimethylsilydiethylamine(DMSDEA), dimethylaminopentamethyldisilane (DMDS), and N,N-dimethylaminopentamethyldisilane(DMDS). The hydrogen radicals in the photoresist mask 240 are displaced by silicon atoms in the silylating agent to form silylated layer 250. As shown in FIG. 2H, a top silylated portion 252 is formed on the top surface 242 while a sidewall layer silylated portion 254 is formed on the sidewall surface 244 of the photoresist mask 240.

Referring to FIG. 2I, the top portion 252 of the silylated photoresist is removed preferably by using a plasma dry etch or a sputtering process. The sidewall layer portion 254 of the silylated photoresist remains. The sidewall layer portion 254 forms the silylated photoresist sidewall spacer 264 shown in FIG. 2J.

Referring to FIG. 2J, the photoresist layer 240 is then removed preferably by using an oxygen plasma to form structure 200 J. The silylated photoresist sidewall spacer 264 is not removed by this process. A three-dimensional view of the silylated photoresist spacer 264 is shown in FIG. 2J'. A top view (parallel to the x-y plane) of the silylated photoresist spacer 264 and its positioning relative to the edges 132 of the conductive layers 130A,B is shown in FIG. 2J'. As shown, the silylated photoresist spacer 264 overlies a portion of each of the edges 132.

Using the spacer 250 as a mask, the conductive layers 130A,B are then etched. Etching removes a portion of each of the conductive layers 130A,B and forms raised portions underneath the spacer. Referring to FIG. 2K, at least a portion of each of the conductive layers 130A,B that is not covered by the spacer 264 is etched away and removed to form the recessed edges 132'. However, at least a portion of each conductive layer that is covered by the oxide spacer 270B is at least partially protected from the etch thereby forming the raised portions 135 extending upwardly from the recessed edges. FIG. 2K is a three-dimensional representation while FIG. 2K' is a cross-sectional view parallel to the y-z plane.

The etch used may be a wet etch or a dry etch. Preferably, the etch used to form the raised portions is a dry etch such as a plasma etch. The etch is also preferably anisotropic so as to form raised portions 135 having substantially straight sidewalls. However, an isotropic etch may be used which removes a portion of the conductive material underneath the spacer and forms raised portions with sloped or tapered sidewalls. Hence, the raised portion 135 may be tapered (where the degree of tapering is controlled by the etching process used). Preferably, the raised portions 135 preferably have a height of about 500 to about 2500 angstroms.

A layer 145 of dielectric material (such as silicon dioxide) is then conformally deposited into the recesses 138 and on top of the structure 200K using conventional deposition methods (such as chemical vapor deposition) to form the structure 200L shown in FIG. 2L. The dielectric layer 145 and the spacer 264 may then be chemically mechanically polished (CMP) to expose at least a portion of the top surfaces or tips 137 of raised portions 135 and form the structure 200M shown in FIG. 2M. Referring to FIG. 2N, a layer of memory material 290 is then deposited over the structure 200M and over at least a portion of the exposed tips 137. A second electrical contact 300 (i.e., a top electrode) is deposited over the memory material to form the memory element 200N shown in FIG. 2N.

It is noted that, after chemical mechanical polishing to form the structure 200M shown in FIG. 2M (and before the deposition of the memory material), a barrier layer may, optionally, be formed on top of the structure 200M. (Hence, the barrier material would be formed between the top surface of the raised portion and the memory material). Barrier layer materials may be chosen to increase the conductivity between the electrical contact and the memory material, and/or improve the adhesion between the electrical contact and the memory material, and/or to prevent the electromigration of the electrical contact material into the memory material. Examples of certain barrier layer materials include, but are not limited to, titanium silicide, cobalt silicide and tungsten silicide.

A programmable resistance memory material is then disposed adjacent at least a portion of the raised portion. Referring to FIG. 2N, a programmable resistance memory material is preferably deposited adjacent at least a portion of the tip 137 of raised portion 135. A conductive layer 300 is deposited on top of the memory material 300. It is noted that only the tip 137 (or a portion of the tip) of each of the sidewall layers 130'A,B is adjacent to the memory material while the rest of each of the sidewall layers 130'A,B is remote to the memory material. Hence, all electrical communication between each of the bottom electrodes 130'A,B and the memory material 290 is through all or a portion of the respective tip 137.

Referring again to FIGS. 2K and 2K', it is again noted that etching the conductive sidewall layers forms the narrow recesses 138 where the conductive layers are not underlying the spacer 250. After etching the conductive layers to form the recesses, it may be desirable to then etch the surrounding oxide regions 128 and 140 to the same level as the recessed edges 132' prior to depositing the oxide layer 145 (as shown in FIG. 2L). This would eliminate the need for the insulation material 145 to fill the narrow recesses 138. This would also make the subsequent chemical mechanical processing step (to get to the structure 200M shown in FIG. 2M) easier.

As noted, the raised portions or protrusions as well the remaining conductive layer may be formed from any conductive material. Examples of materials include, but are not limited to, n-type doped polysilicon, p-type doped polysilicon, p-type doped silicon carbon alloys and/or compounds, n-type doped silicon carbon alloys and/or compounds, titanium-tungsten, tungsten, tungsten silicide, molybdenum, and titanium nitride. Other examples include titanium carbon-nitride, titanium aluminum-nitride, titanium silicon-nitride, and carbon.

In the embodiment of the memory device shown in FIG. 2N, the raised portion 135 extends from an edge of conductive layer 130'A,B. In the example shown, the conductive layer is a substantially planer, sidewall layer formed along the sidewall surface of a trench by depositing a layer of conductive material into the trench and then anisotropically etching the layer to remove the horizontally disposed surfaces.

Raised portions or protrusions may be formed on any conductive material. In particular they may be formed on any conductive layer by using the silylation photoresist sidewall spacer as described above. Raised portions may be formed on an edge of on any conductive layer, and, in particular, on the edge of any conductive sidewall layer. Conductive sidewall layers having different physical geometries may be made by the conformal deposition of a conductive material onto sidewall surfaces having various shapes and configurations. For example, a layer of conductive material may be substantially conformally deposited onto the sidewall surfaces of an opening, a mesa or a pillar. The opening, mesa or pillar may be circular, square, rectangular or irregularly shaped. Anisotropically etching the conformally deposited conductive layer, removes the horizontally disposed portions of the deposited layer and leaves only one or more vertically disposed portions. The remaining one or more vertically disposed portions are sidewall layers in the form of conductive sidewall spacers having different physical geometries.

The sidewall spacer formed, for example, by the conformal deposition of a conductive material into a cylindrical opening (followed by an anisotropic etch) will be a conductive sidewall layer in the form of a cylindrical surface having two open ends. The top edge of the layer will be in form of an annulus. Changing the shape of the opening (or pillar or mesa) will change the shape of the sidewall spacer. That is, the lateral cross section of the conductive sidewall spacer (i.e. the cross section parallel to the substrate) corresponds to the shape of the opening, mesa or pillar. Alternately, it may be rectangular or irregularly shaped.

Figure 3A:
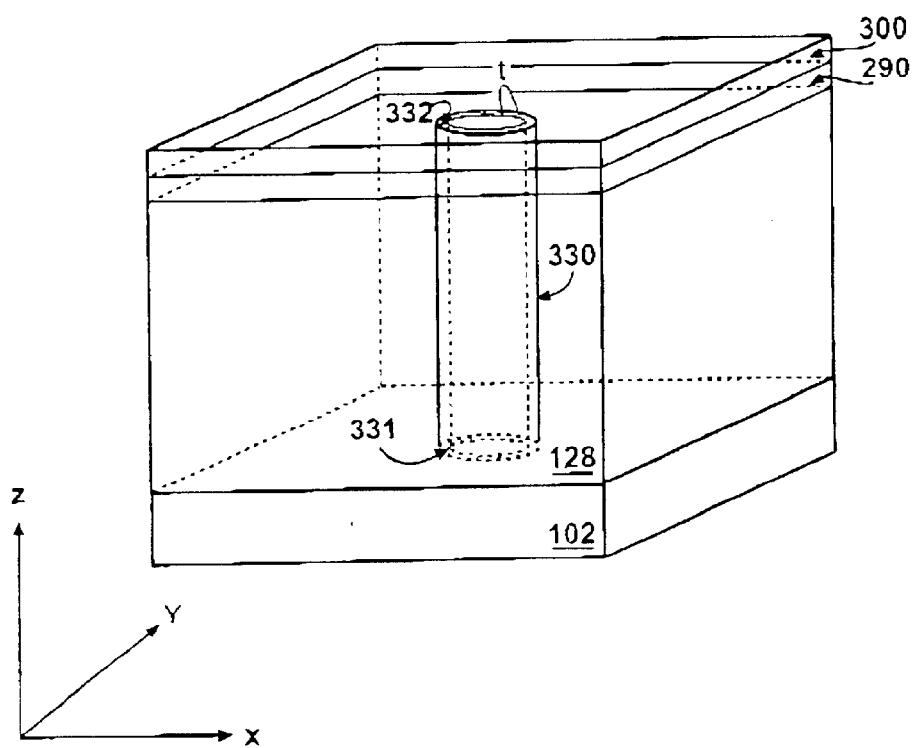
FIG. 3A is a three-dimensional view of a memory device having a cylindrically shaped conductive sidewall spacer as an electrical contact.

FIG. 3A shows a three-dimensional view of a cylindrical, conductive sidewall spacer 330 formed in a circular opening (and thus having a horizontal cross-section in the shape of an annulus). The cylindrical conductive spacer 330 comprises a single, cylindrically shaped sidewall layer. The thickness "t" of this cylindrically shaped sidewall layer is the distance between the inner and outer cylindrical surfaces as shown in FIG. 3A. The cylindrical sidewall layer has two open ends or "rims" forming the top edge 332 and the bottom edge 331. The top and bottom edges 332 and 331 of the cylindrically shaped conductive sidewall layer 330 are annular surfaces formed by intersecting the conductive layer 330 with planes substantially parallel to the substrate. In the embodiment shown in FIG. 3A, the layer of memory material 290 is adjacent only to the top end (i.e., the top edge 332) of the cylindrical sidewall spacer 330. Substantially all electrical communication between the conductive spacer 330 and the memory material 290 is through the top edge 332 or a portion of the top edge 332. Hence, the area of contact between the conductive spacer 330 and the memory material 250 is the edge 332 or a portion of the edge 332. (That is, all or a portion of the annular surface 332).

Figure 3B:
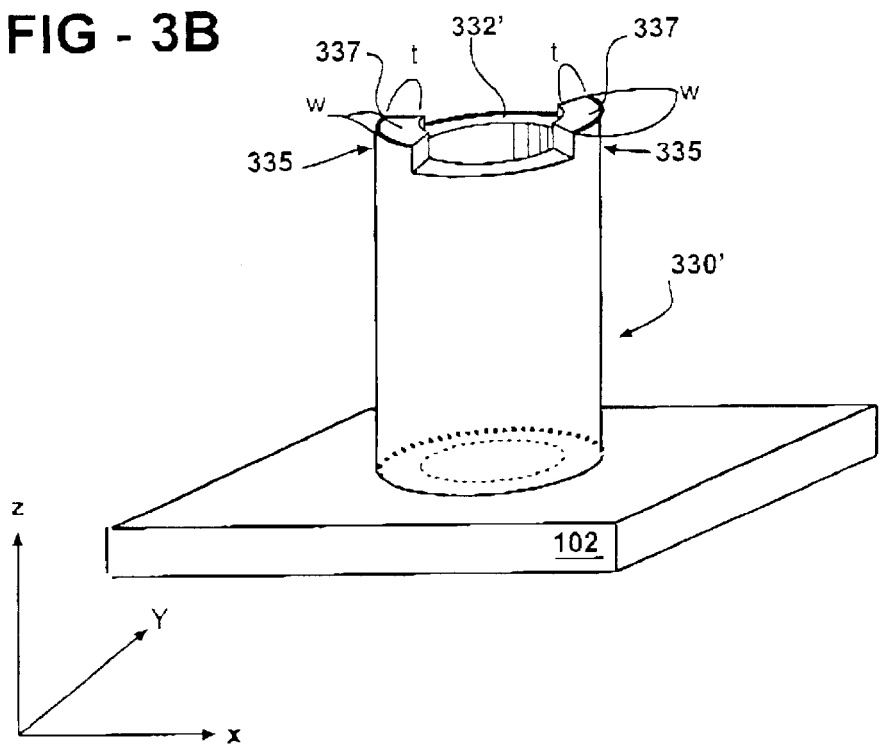
FIG. 3B is a three-dimensional view of cylindrically shaped conductive sidewall spacer with raised portions extending from the top edge of the sidewall spacer.

The raised portions or protrusions may be formed atop the annular edge of a cylindrical sidewall layer. FIG. 3B is a three-dimensional representation of a cylindrical conductive sidewall layer 330' that includes raised portion or protrusions 335 that extend from the edge 332'. Each raised portion 335 extends from edge 332' to a distal end or tip 337 (also referred to as a top surface) adjacent the memory material (not shown). As noted above, the raised portions 335 are not limited to any particular shape. In the embodiment shown, the raised portions 335 have a thickness "t" (proportional to the thickness of the conductive layer) and a width "w". Conductive layer 330' is in the form of a cylindrical conductive spacer. The raised portions may be formed on the top edge of the cylindrical conductive layer 330' with the use of the silylated photoresist sidewall spacer as described above. An example of forming the raised portions atop the annular edge of a cylindrical sidewall layer will be given below. Preferably, substantially all electrical communication between the conductive spacer 330' and the memory material is through one or more of the raised portions 335. More preferably, substantially all electrical communication between the conductive spacer 330' and the memory material is through at least a portion of the top surface or tip 337 of one or more of the raised portions 335. The electrical contact 330' and memory material may be positioned so that only the top surface or tip 337 of one or more of the raised portions 335 are adjacent to the memory material while substantially all of the remaining portion of the electrical contact is remote to the memory material.

Figure 3C:
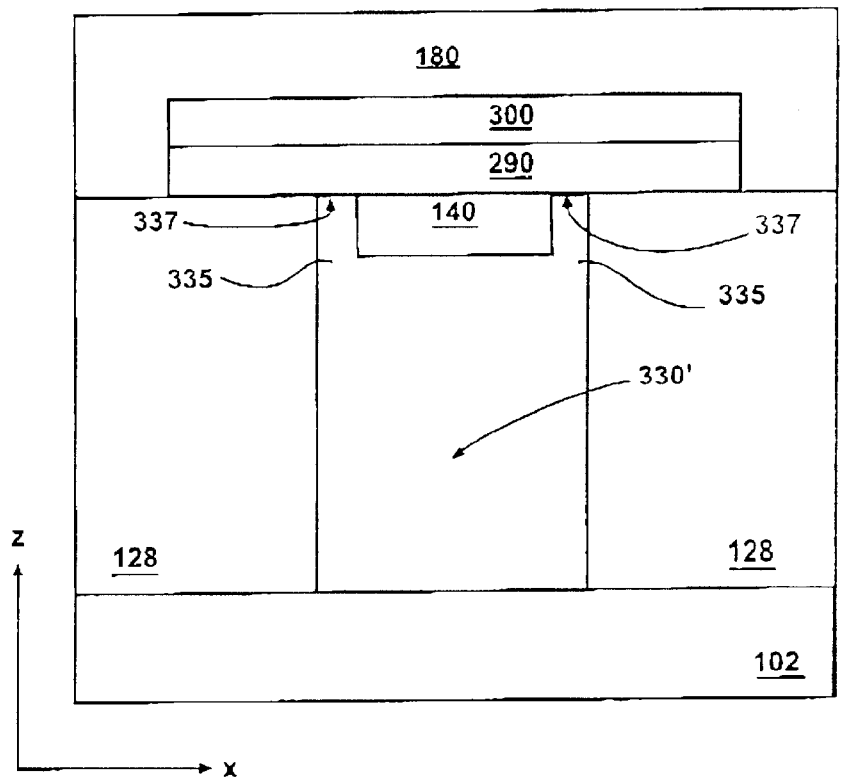
FIG. 3C is a side view of a memory element using the electrical contact from FIG. 3B.

FIG. 3C is a two dimensional side view (parallel to the x-z plane) of the cylindrical conductive layer 330' showing the memory material 290 as well as the top electrical contact 300 (and also dielectric materials 128, 140 and 180). In FIG. 3C both of the raised portions 335 are in electrical communication with the memory material. However, it is also possible that the memory material and the raised portions 335 and the memory material be positioned relative to each other so that only one of the protrusions 335 is touching the memory material. In the embodiment shown in FIG. 3C only the top surfaces or tips 337 are adjacent the memory material while the remainder of the electrical contact is remote to the memory material.

Figure 4A:
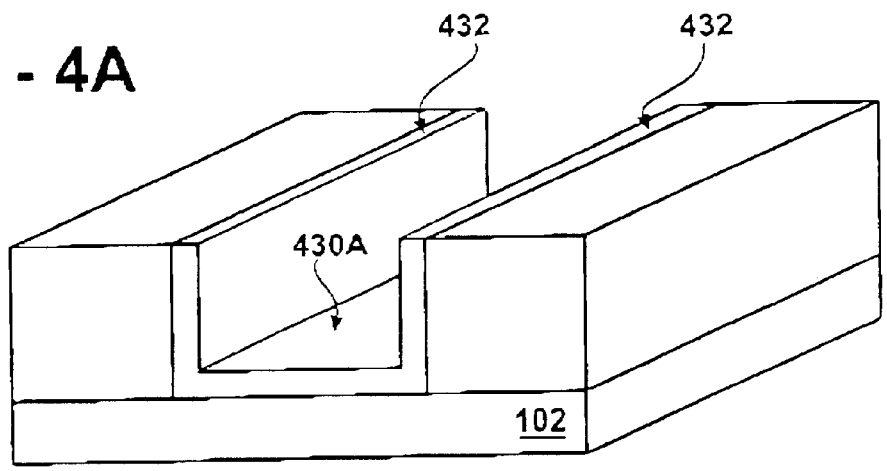
FIG. 4A is a conductive liner formed in a trench.
Figure 4B:
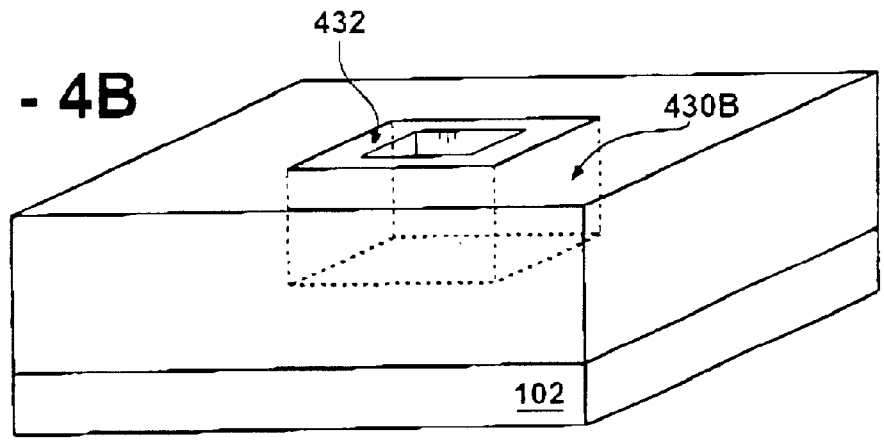
FIG. 4B is a conductive liner formed in a rectangular opening.
Figure 4C:
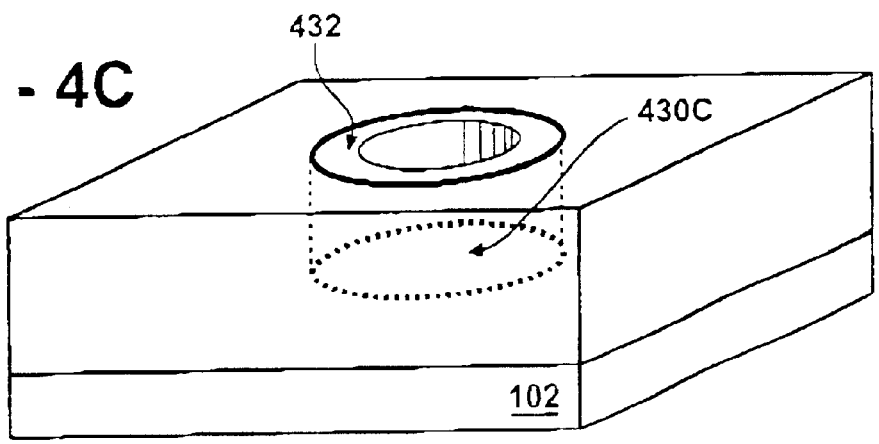
FIG. 4C is a conductive liner formed in a circular opening.

In the embodiments shown above, the conductive sidewall layers have been formed as conductive sidewall spacers. However, it is possible to form conductive sidewall layers in other ways. For example, a conductive sidewall layer may be formed as a portion of a "conductive liner". The conductive liner is preferably a single layer of conductive material deposited on the sidewall surfaces as well as the bottom surface of a trench, opening, or the like. Examples of conductive liners are shown in FIGS. 4A–C. In FIG. 4A, the conductive liner 430A is formed in a trench. FIG. 4B is an example of a conductive liner 430B formed in a rectangular opening. FIG. 4C is an example of a conductive liner 430C formed in a circular opening. Of course, other shapes are also possible. As shown in the FIGS. 4A–4C, each conductive liner has one or more sidewall layer portions as well as a bottom layer portion. The top end of the conductive liners is an open end having a top edge 432. It is noted that the U-shaped conductive liner shown in FIG. 4A has a "dual" top edge 432.

Figure 5A:
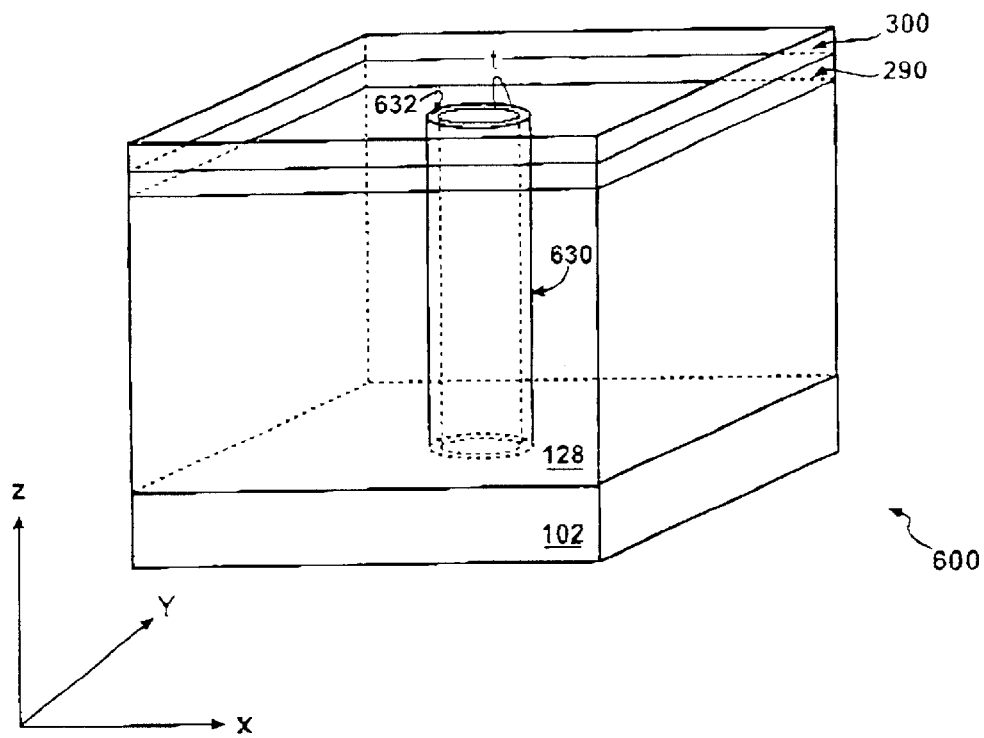
FIG. 5A is a three-dimensional view of a memory device using a conductive liner as an electrical contact.
Figure 5B:
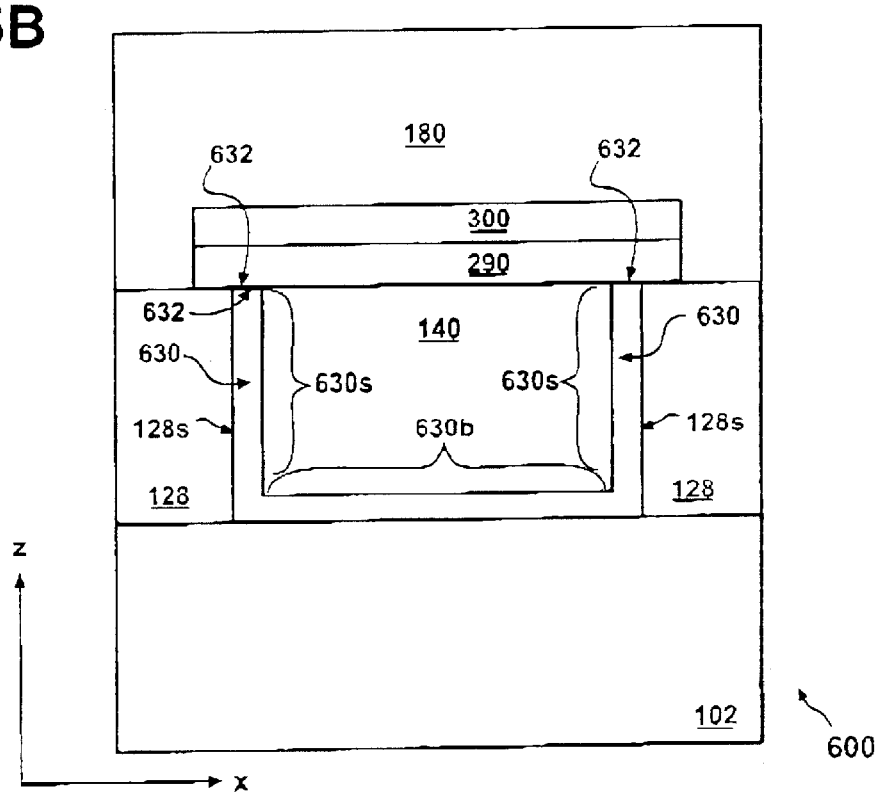
FIG. 5B is a cross-sectional view of the memory device of FIG. 5A.

FIGS. 5A and 5B depict an embodiment of the memory element 600 where the bottom electrical contact is a conductive liner 630 formed in a circular opening. FIG. 5A is a three-dimensional view of the memory element while FIG. 5B is a cross-sectional view in the x-z plane. As seen, the conductive liner 630 is a cylindrical shell having an open top end (remote to and facing away from the substrate 102) and a closed bottom end (preferably adjacent to and in electrical communication with the substrate). The open top end has an annular top edge 632. The conductive liner 630 comprises a cylindrically shaped sidewall layer portion 630S and a bottom layer portion 630B.

In the example shown in FIGS. 5A and 5B, the conductive liner 630 is in the shape of a cylindrically shaped cup. As shown in FIG. 5B, the sidewall layer portion 630S forms the side of the cup while the bottom layer portion 630B forms the bottom of the cup. The top edge 632 may be referred to as the "rim" of the cup. The conductive liner may have other cup shapes such as a paraboloid, hemisphere, cone, and frustum.

The layer 290 of memory material is preferably a planar, substantially horizontally disposed layer positioned adjacent to the open end (i.e., top edge 632) of the conductive liner 630. Hence, the memory material is adjacent only to the top edge 632 (i.e., the rim) of the conductive liner 630 or a portion of the top edge 632 of the conductive liner. The remainder of the conductive liner 630 is remote to the memory material. Preferably, substantially all electrical communication between the conductive liner 630 and the memory material occurs through the edge 632 or a portion of the edge 632. Hence, the area of contact is defined by all or a portion of the edge 632. The edge 632 is an annulus having a thickness equal to the thickness of the conductive liner 630. The thickness of this annulus, and hence the area of contact between the conductive liner and the memory material may be reduced by decreasing the thickness of the conductive liner 630 deposited into the circular via. It is noted that it is possible that one or more intermediate layers be disposed between the memory material and the conductive liner.

Figure 5C:
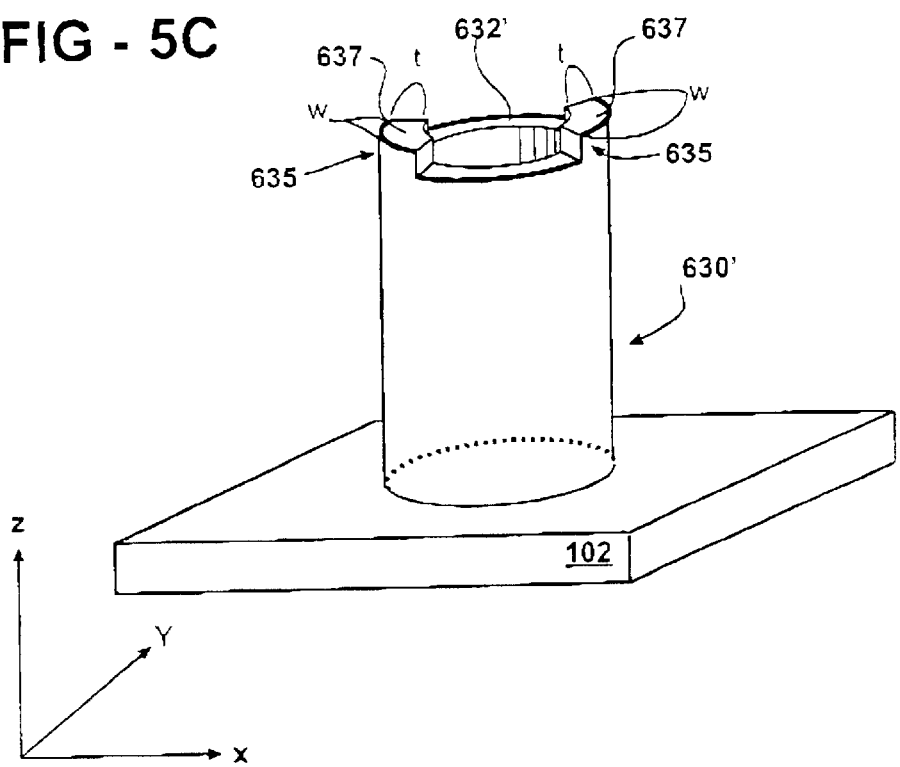
FIG. 5C is a three-dimensional view of a cylindrically shaped conductive liner with raised portions extending from the top edge of the conductive liner.

One or more raised portions or protrusions may be formed on the top edge of the sidewall portion of a conductive liner. FIG. 5C shows the cylindrical conductive liner 630' disposed on top of a substrate 102. In this embodiment, the conductive liner 630' includes at least one raised portion or protrusion 635. Each of the raised portions extends from the top edge 632' to distal ends or tips 637 adjacent the memory material (the memory material is not shown in this diagram). In the embodiment shown, the raised portions 635 each have a thickness which is substantially the same as the thickness of the remainder of the conductive liner 630'. Preferably, substantially all electrical communication between the conductive sidewall spacer 630' and the memory material is through one or more of the raised portions 635. More preferably, substantially all electrical communication between the conductive spacer 630' and the memory material occurs through at least a portion of the top surface or tip 635 of one or more of the raised portions 635. Hence, the electrical contact 630' and memory material may be positioned so that only the top surface 637 of one or more of the raised portions 635 is adjacent to the memory material while substantially all of the remaining portion of the electrical contact is remote to the memory material.

Figure 5D:
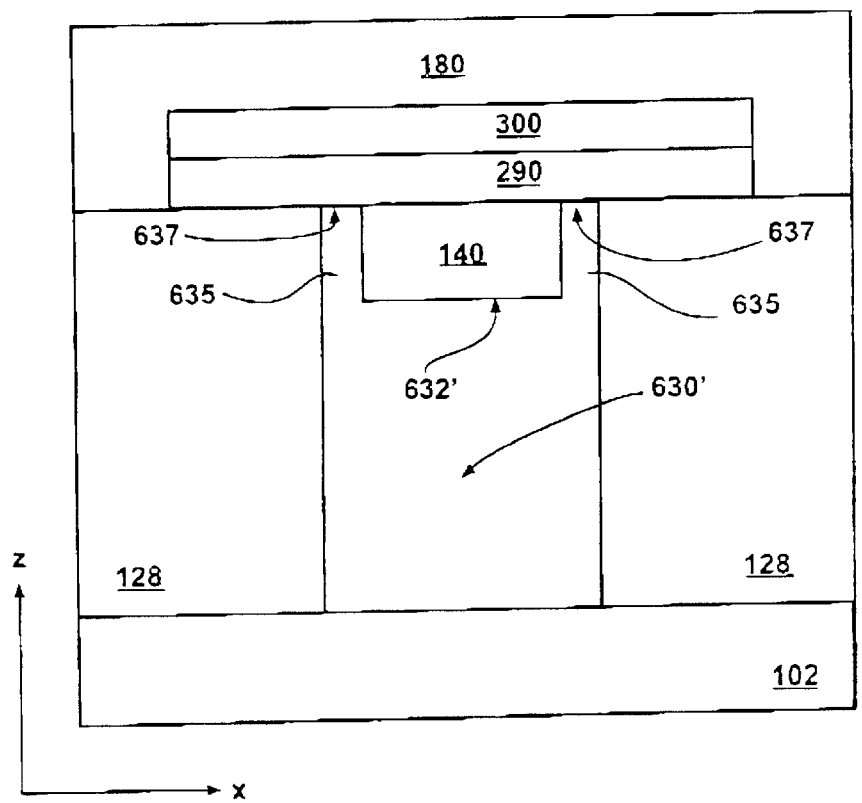
FIG. 5D is a side view of a memory element incorporating the electrical contact from FIG. 5C.

FIG. 5D shows a side view of a memory element (parallel to the x-z plane) made using the conductive liner 630'. Shown are memory material 290 and second electrical contact 300. In FIG. 5D, the tips 637 of both protrusions 635 are in electrical contact with the memory material; however, it is possible that the memory material be positioned so that it is in electrical contact with only the upper surface 637 of only one of the protrusions 635. The base of the conductive liner 630' is adjacent to and in electrical communication with the substrate 102.

Figure 6A:
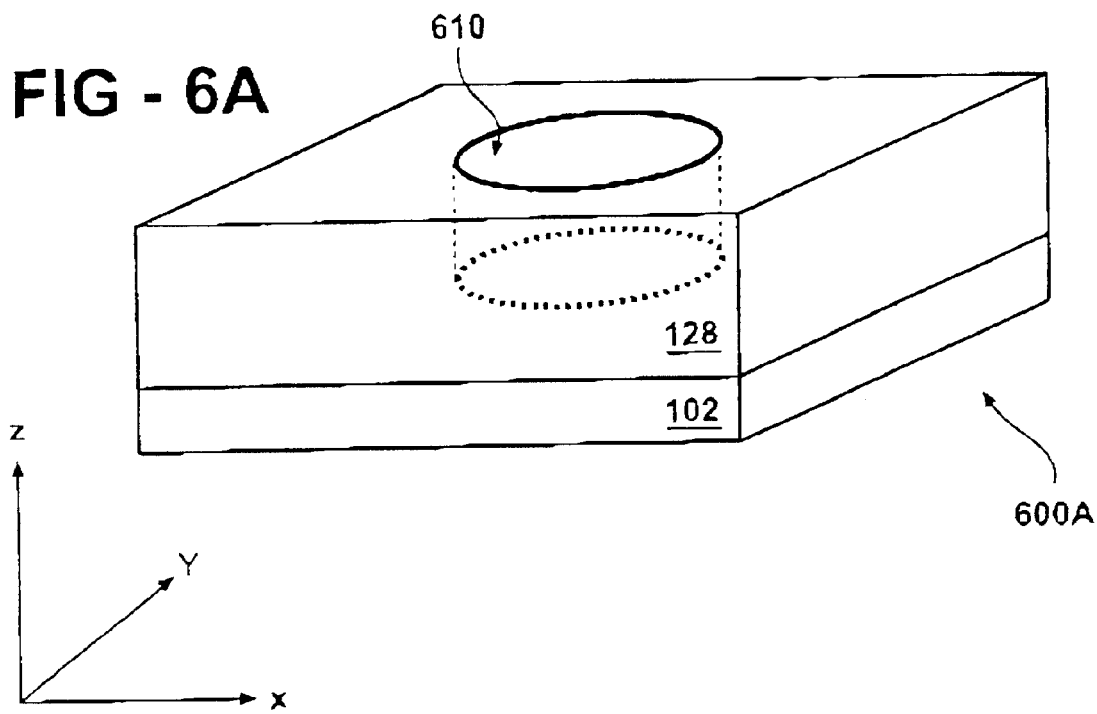
Figure 6B:
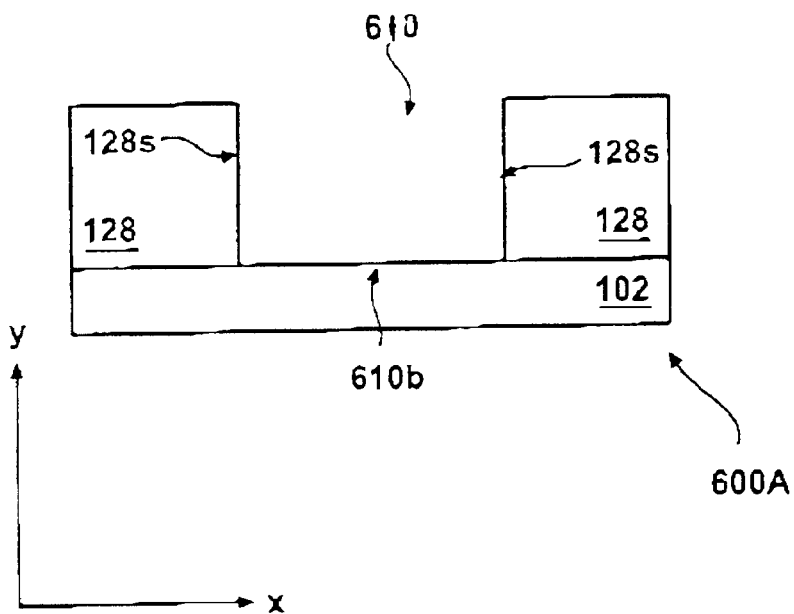

The raised portions 635 may be formed with the use of silylated photoresist spacer as described above. An embodiment of a method for fabricating the conductive liner 630' is shown FIGS. 6A–6M'. Referring first to FIG. 6A, a substrate 102 is provided and a dielectric layer 128 is deposited on top of the substrate 102. The dielectric layer may be formed from silicon dioxide and may be deposited by a chemical vapor deposition process. The dielectric layer 128 is then appropriately masked and etched to form an opening 610 in the dielectric 128 as shown. The opening may be round, square, rectangular or irregularly shaped. In the embodiment shown in FIG. 6A, the resulting structure 600A is a circular opening 610 which is formed in the dielectric 128. FIG. 6B is a cross-sectional view (parallel to the y-z plane) of the structure 600A shown in FIG. 6A. The sidewall surface 128S and the bottom surface 610B of the circular via 610 is shown in FIG. 6B.

Figure 6C:
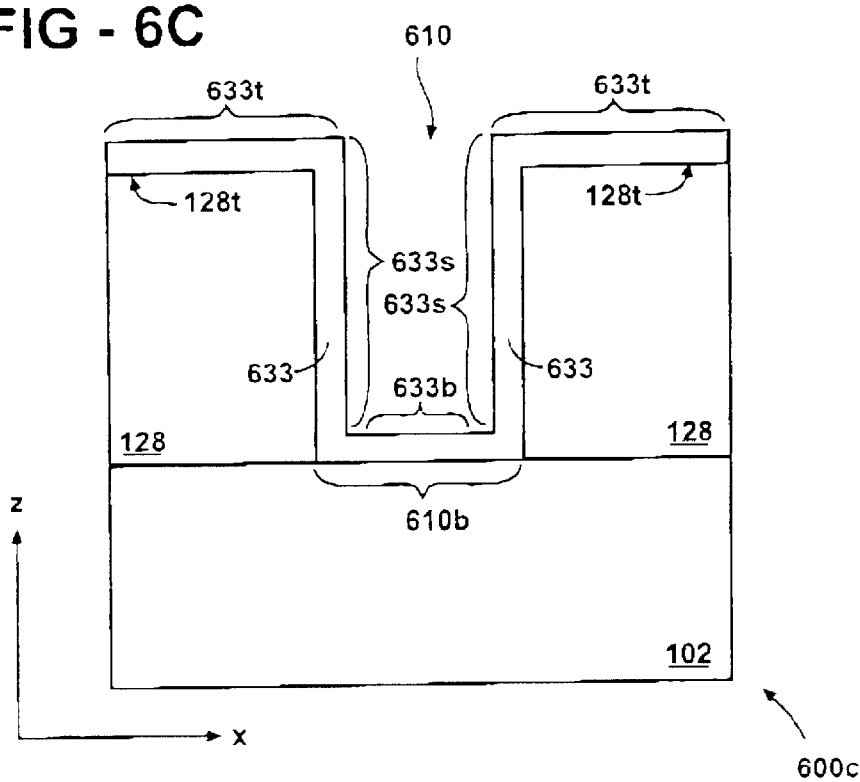

A layer 633 of a conductive material is deposited on top of the structure shown in FIGS. 6A and 6B to form the structure 600C shown in FIG. 6C. The layer 633 of conductive material is conformally deposited on top surfaces 128T of the dielectric region 128, on the sidewall surface 128S of the region 128 and the bottom surface 610B of the opening 640. Hence, the layer 633 has a top portion 633T, a sidewall layer portion 633S, and a bottom layer portion 633B.

Figure 6D:
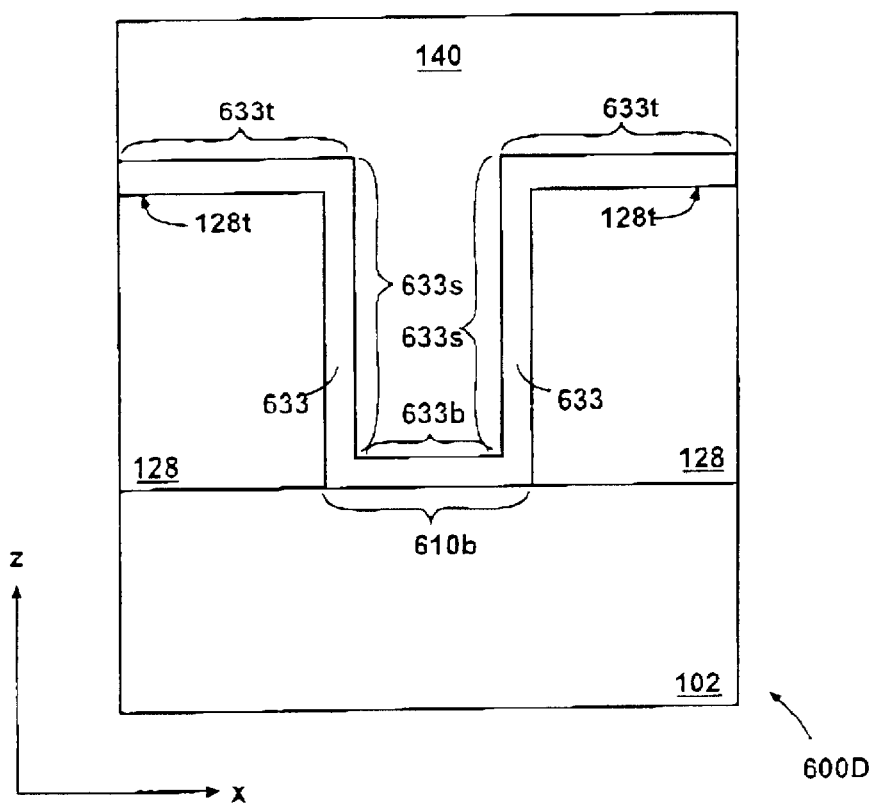
Figure 6E:
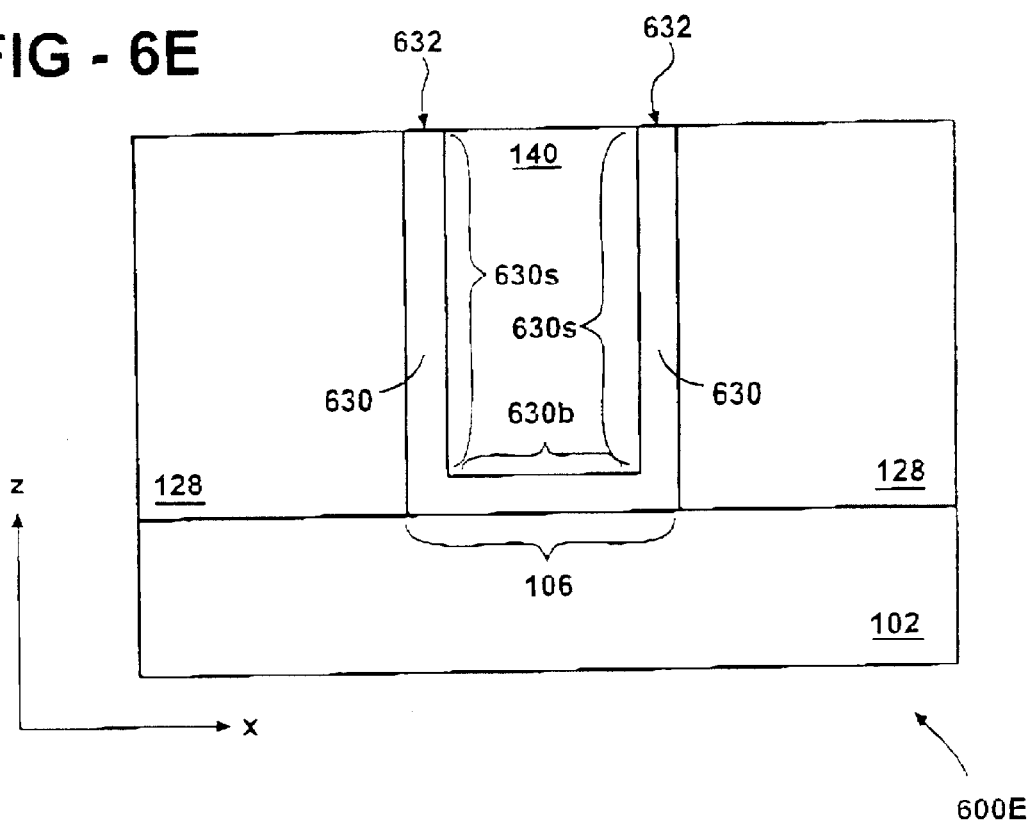
Figure 6E:
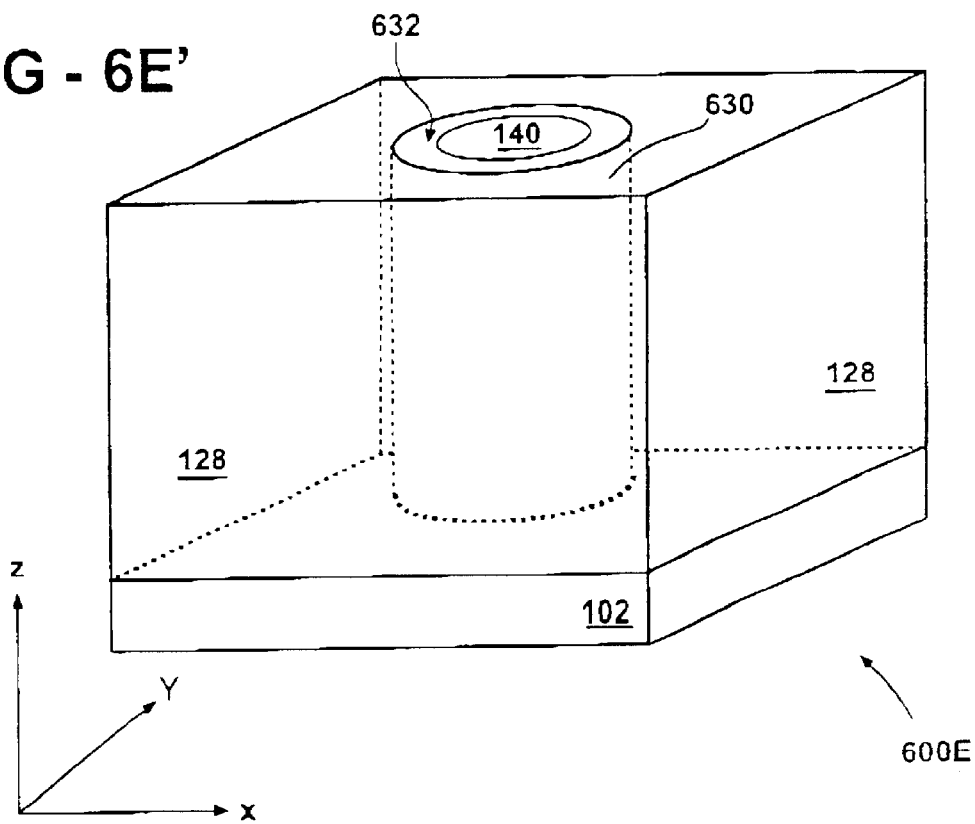

A layer of dielectric material 140 (such as silicon dioxide) may then be deposited on top of the layer 633 so as to fill the via 610 and form the structure 600D shown in FIG. 6D. The structure 600D may then be chemically mechanically polished (CMP) or dry etched so as to planarize the top surface thereby removing the top surface 633T portion of the layer 633 and forming a cylindrical, cup-shaped conductive liner. The CMP step also exposes at least a portion of the top edge 632 of the conductive layer 630. This is shown as structure 600E in FIG. 6E where the conductive liner 630 has a sidewall layer portion 630S along the sidewall 128S and a bottom layer portion 630B along the bottom surface 610B. Furthermore, the conductive liner 630 has a top edge 632 which is in the shape of an annulus. Preferably, the planarization step forms a substantially planar top edge 632. FIG. E' shows a three-dimensional representation of the structure 600E from FIG. 6E.

Figure 6F:
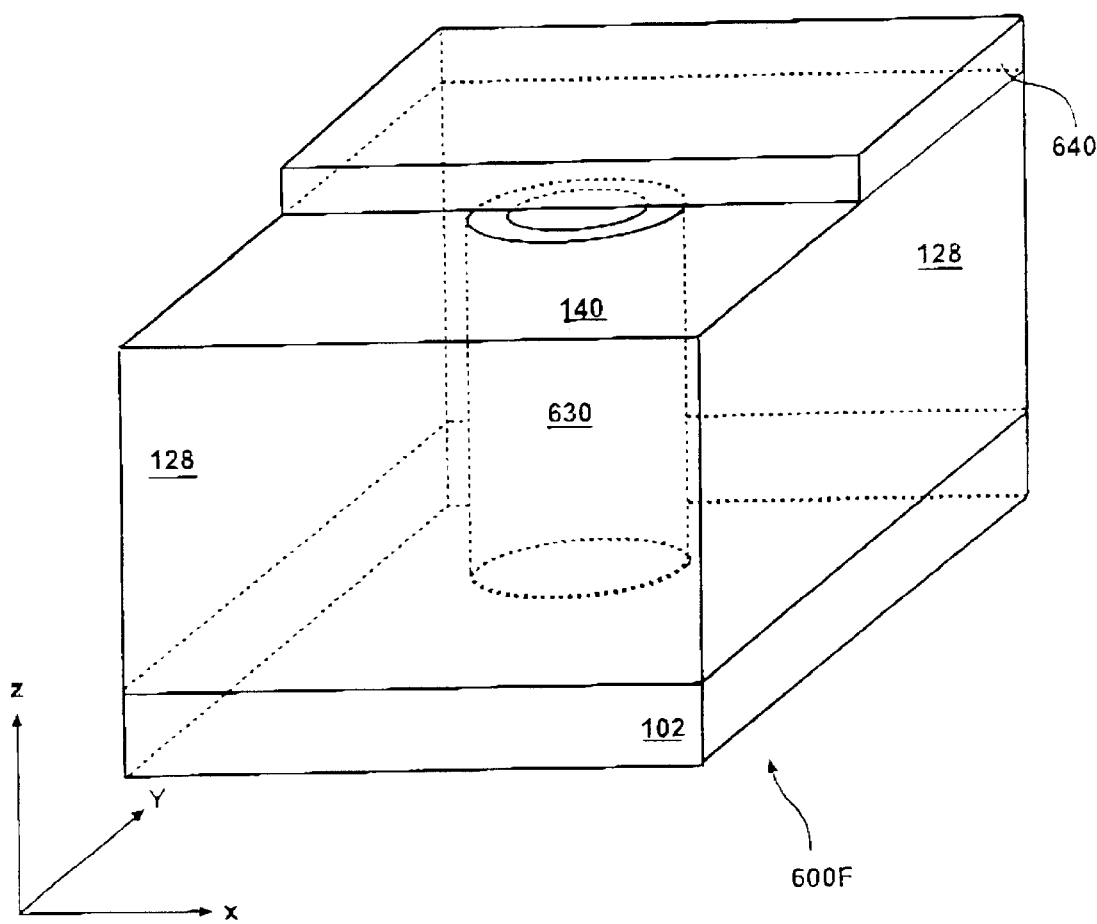
Figure 6F:
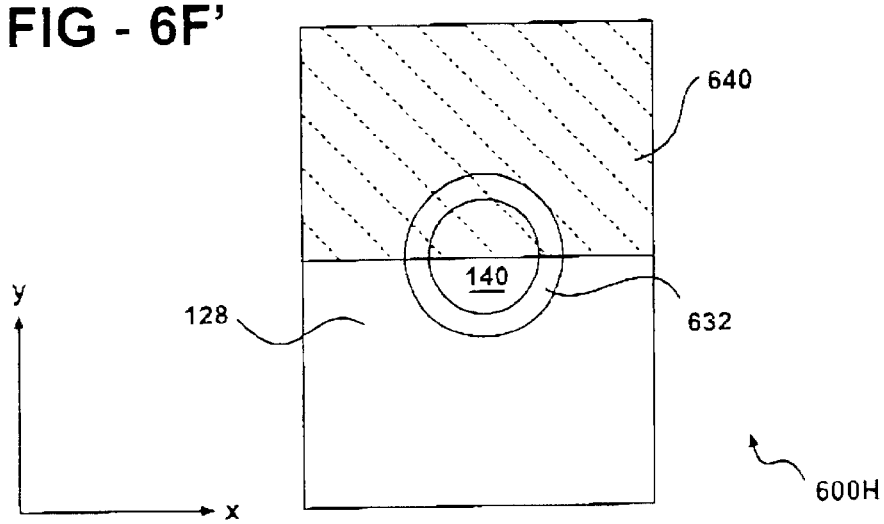

One or more raised portions or protrusions may be formed atop the annular edge 632 with the use of a silylated photoresist sidewall spacer. The processing steps are the similar to those described above with respect to the conductive sidewall spacers. A photoresist layer is applied over the top surface of structure 600E. The photoresist material is applied over the edge 632. A portion of the photoresist layer is removed and the remaining portion forms the photoresist mask 640 overlying a portion of the exposed edge as shown in the three-dimensional view of FIG. 6F and in the top view (parallel to the x-y plane) in FIG. 6F'. FIG. 6F" is a cross-sectional view parallel to the y-z plane. The photoresist mask 640 has a top surface 642 and a sidewall surface 644.

Figure 6H:
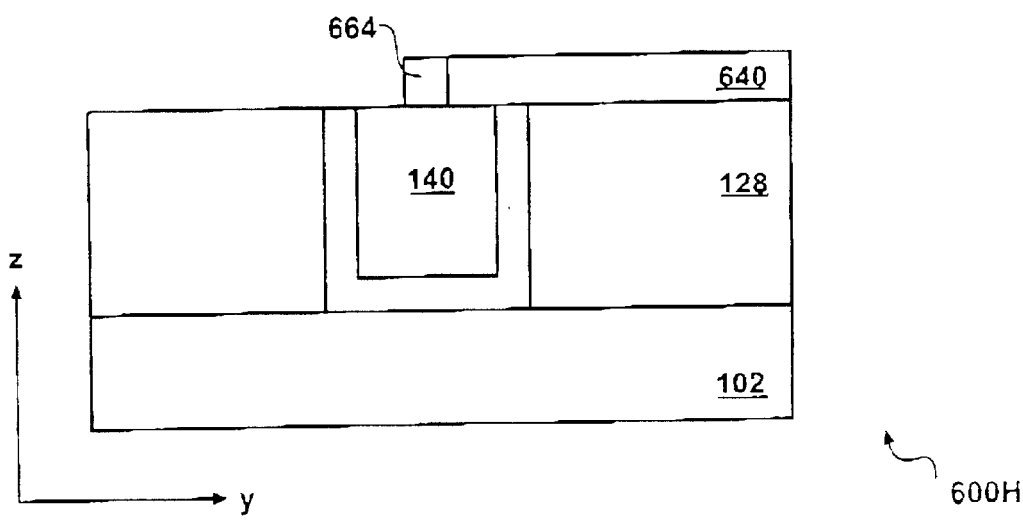
Figure 6I:
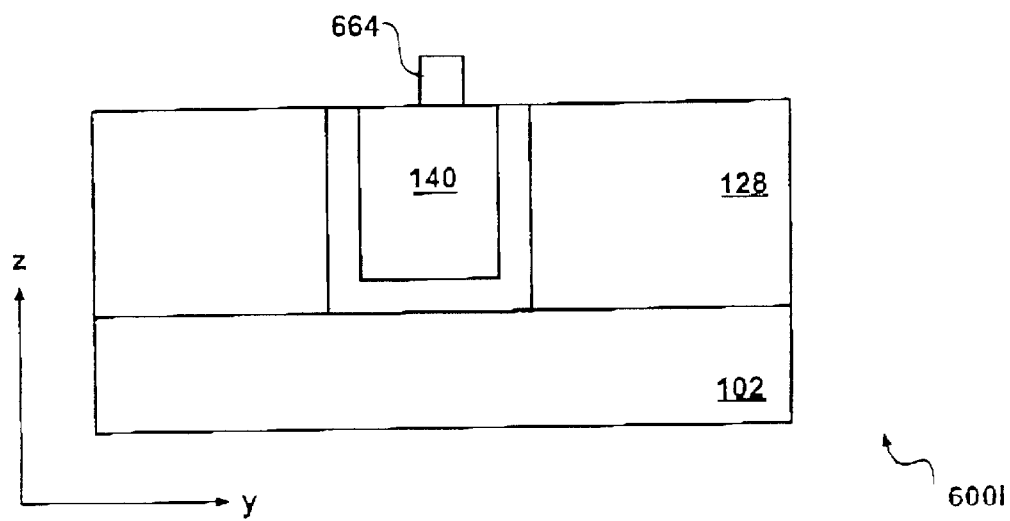
Figure 6I:
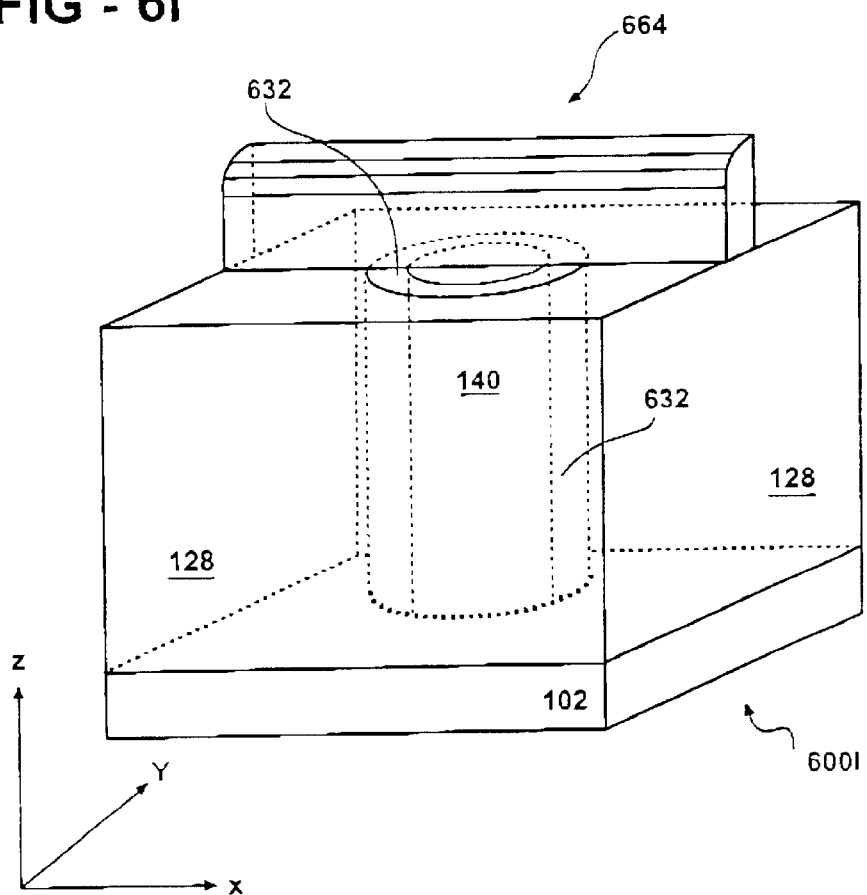
Figure 6I:
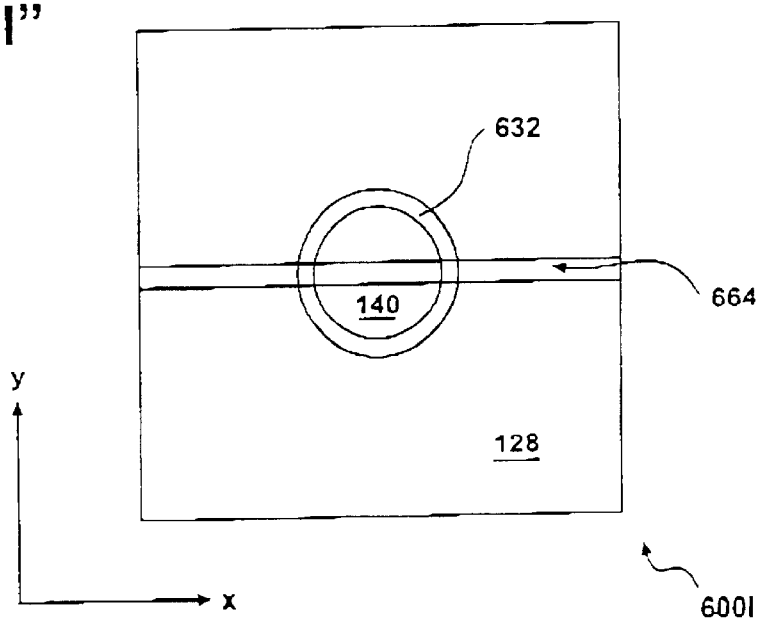

Referring now to FIG. 6G, the photoresist mask is silylated to form the silylation layer 650. The silylation process has been described above. The silylation layer 650 includes a top layer portion 652 formed on the top surface 642 and a sidewall layer portion 654 formed on the sidewall surface 644. Referring to FIG. 6H, the top layer portion 652 is removed preferably by using a plasma dry etch or a sputtering process, leaving the silylated photoresist sidewall layer portion 654. The sidewall layer portion 654 formes the silylated photoresist sidewall spacer 664 shown in FIG. 6H. Referring to FIG. 6I, the photoresist layer 640 is then removed preferably by using oxygen plasma. The silylated photoresist sidewall spacer 654 is not removed by this process. A three-dimensional view of the silylated photoresist spacer 654 is shown in FIG. 6I'. A top view of the positioning of spacer 664 relative to the top edge 632 of the liner 630 is shown in FIG. 6I".

Figure 6J:
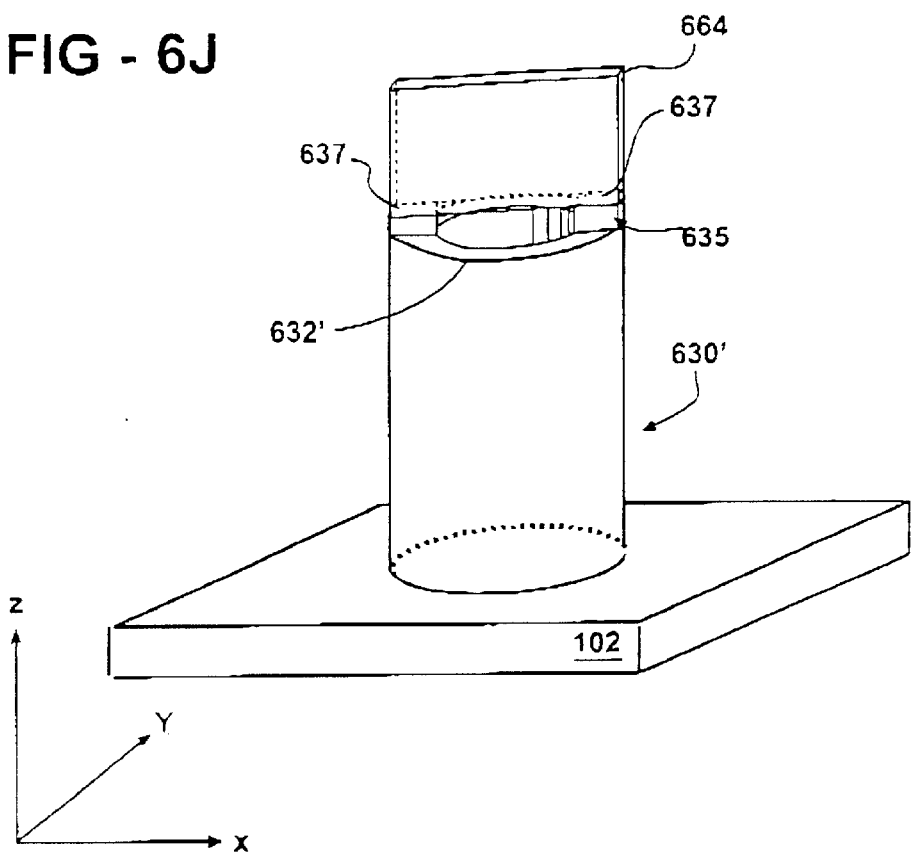
Figure 6J:
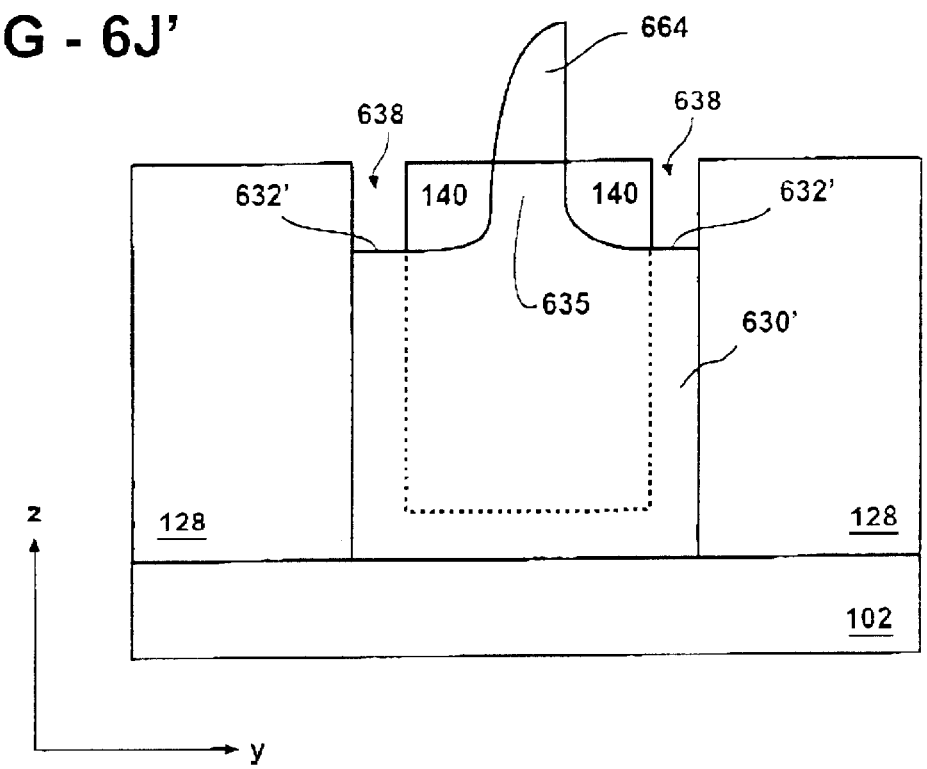

Using, the spacer 654 as a mask, the structure 600I is then etched to remove a portion of the conductive material and form raised portions underneath the spacer. Referring to FIG. 6J, at least a portion of the conductive layer 630 not underlying the spacer 664 is etched away and removed to form the recessed edge 632'. However, at least a portion of the conductive layer covered by the spacer 654 is at least partially protected from the etch to from the raised portions extending from the recessed edge under the spacer. FIG. 6J' is a side view of the conductive liner parallel to the y-z plane. As noted above, the etch may be a wet or dry etch. Also, the etch may be anisotropic or isotropic.

Figure 6K:
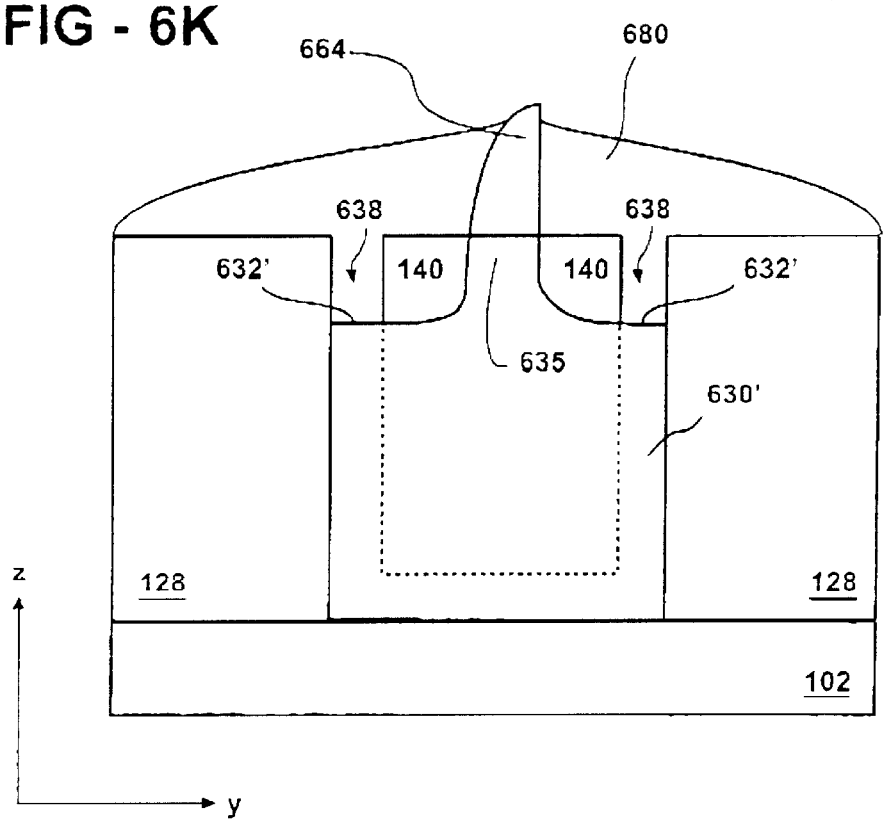
Figure 6L:
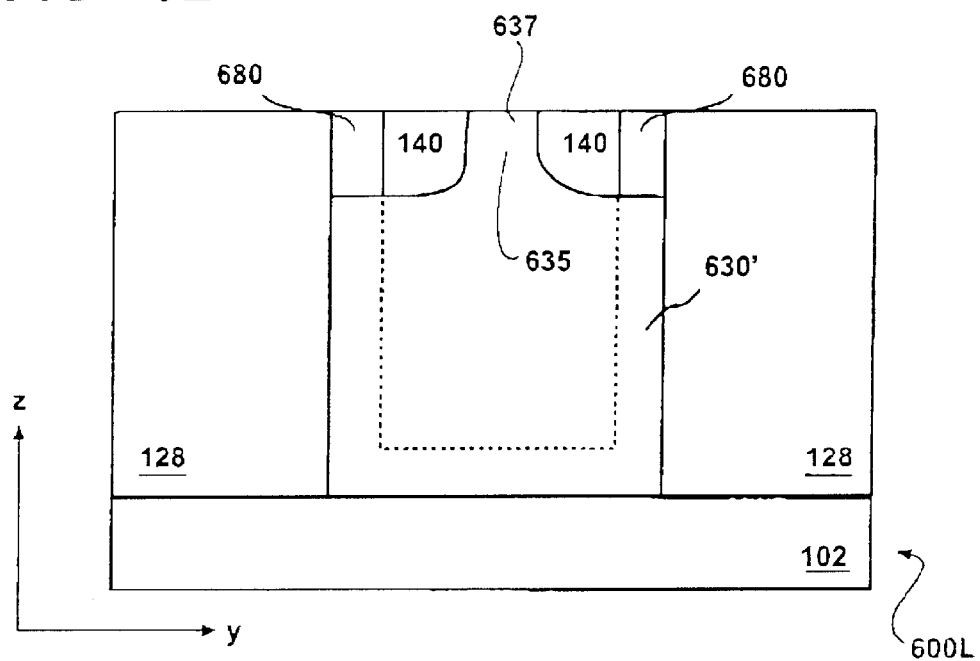
Figure 6M:
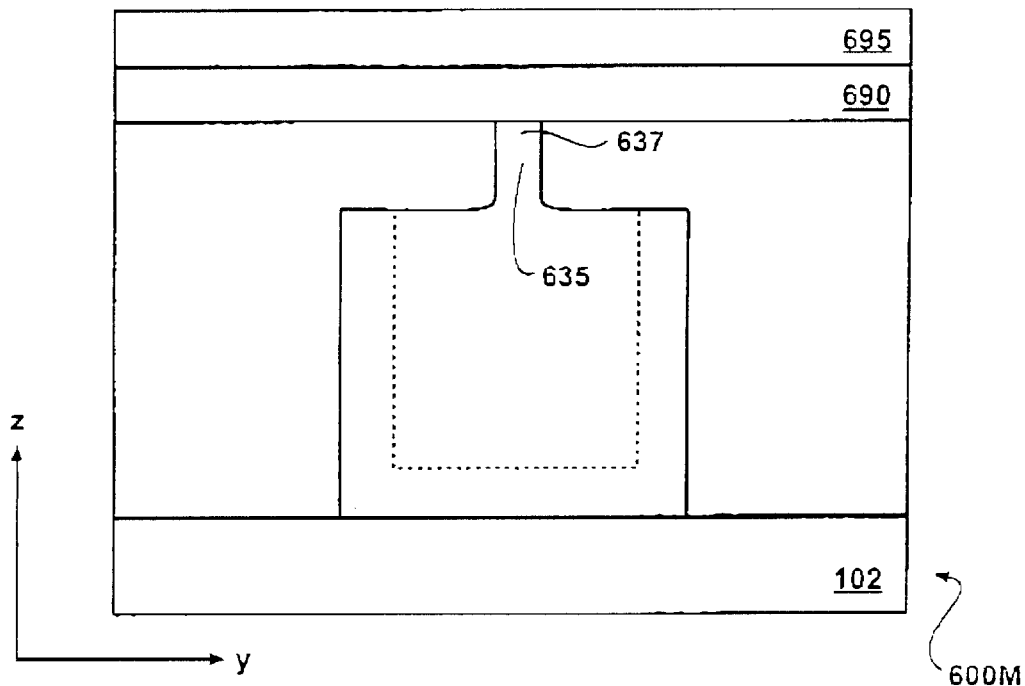
Figure 6M:
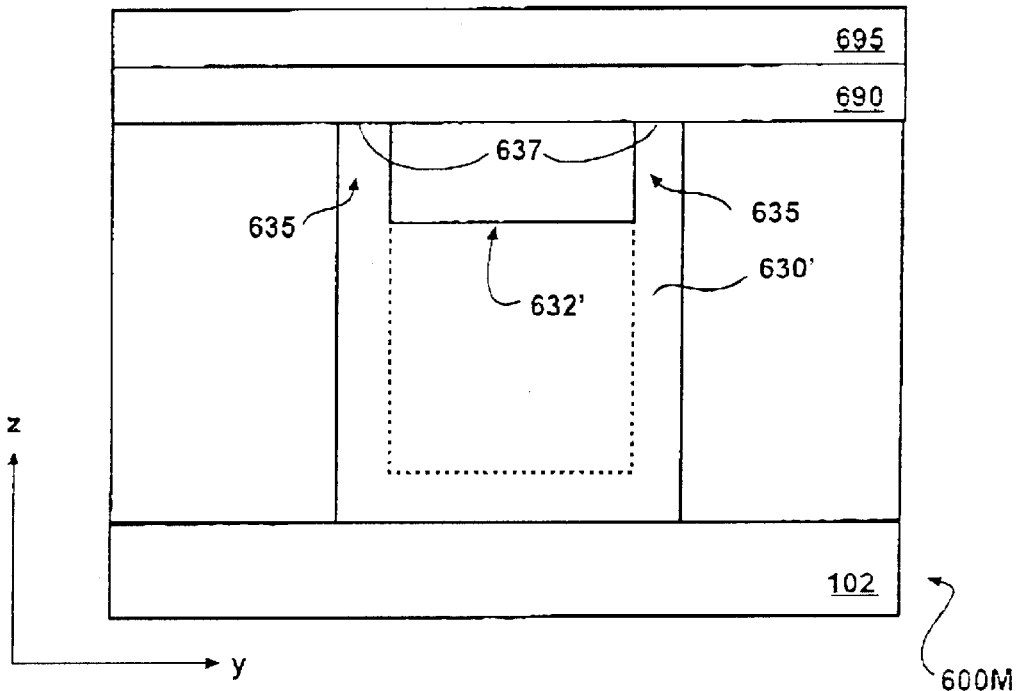

Referring to FIG. 6K, a dielectric layer 680, preferably an oxide, is then deposited into the recession 638 and on top of dielectric layers 128 and 140. The oxide layer 680 and the spacer 664 may then be chemically mechanically polished to expose the top surfaces or tips 637 of the raised portions 635 to form structure 600L as shown in FIG. 6L. A layer of memory material 690 and a top conductive layer 695 may then be deposited on top of structure 600Q to form the memory element 600M shown in FIG. 6M (parallel to the y-z plane) and in FIG. 6M' (parallel to the x-z plane). FIG. 6M' shows an alternate side view of the conductive liner 630' showing both of the raised portions 635 with tips 637 adjacent the memory material 690. Only the top surfaces 637 of the raised portions 635 are adjacent to the memory material 690 while the remainder of the raised portions as well as the remainder of the conductive liner 630' is remote to the memory material 690. It is noted that the memory layer 690 may be positioned to that it is adjacent to only one of the raised portions 635.

Prior to the deposition of the oxide layer 680 shown in FIG. 6K it is possible to etch the dielectric regions 128 and 140 (shown in FIG. 6J') to the level of the recessed edge 632'. This avoids the need to have the oxide material 680 fill the narrow gap 638 and also facilitates the chemical mechanical polishing.

Figure 7:
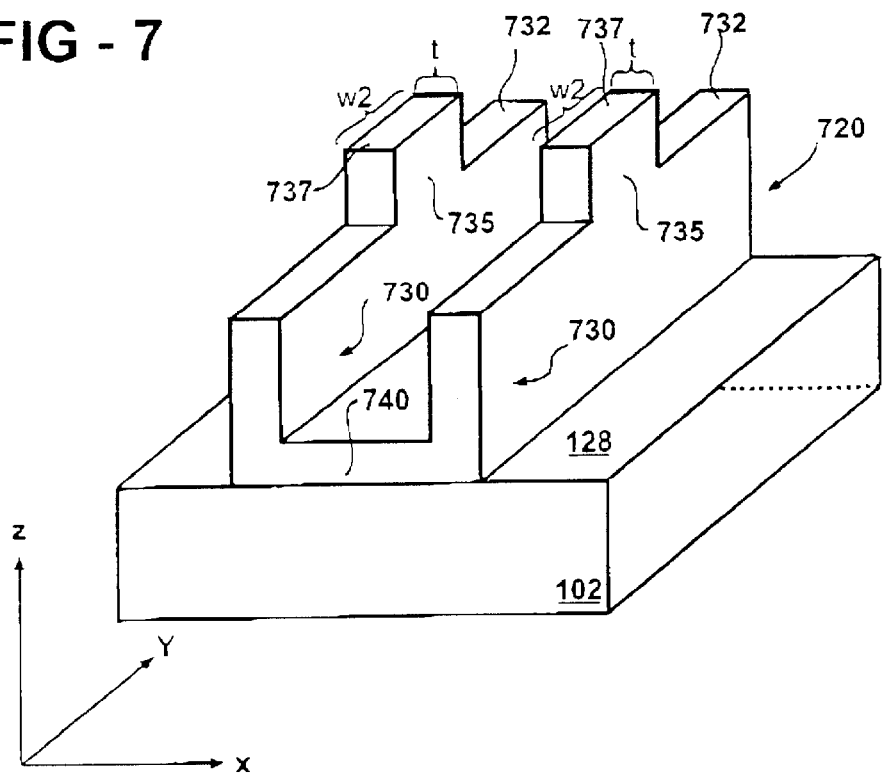
FIG. 7 is an example of a conductive liner with raised portions extending from a top edge of the liner's sidewall layers.

The raised portions or protrusions may be formed on the edge of the sidewall layers of different conductive liners. For example, they may be formed on the conductive liners shown in FIGS. 4A–4C. FIG. 7 provides an example of a U-shaped conductive liner 720 that is formed in a trench. FIG. 7 shows conductive liner 720 having two sidewall layer portions 730 and a bottom layer portion 740. The raised portions or protrusions 735 are formed on the edges 732 of the two sidewall layer portions 730 of the conductive liner 720. The protrusions 735 extend from the edges 732 to tips 737. Substantially all of the electrical communication between the conductive liner 720 and the memory material (not shown) is preferably through one or both of the raised portions 735, and more preferably, through one or both of the top surfaces 737.

Raised portions or protrusions may be formed on any conductive material to form an electrical contact structure. Generally, the conductive material may have any physical geometry. In particular, the raised portions may be formed on the edge of conductive sidewall layer to form novel electrical contact structures. More generally, raised portions may be formed on an edge of any conductive layer, regardless of its shape or orientation.

As seen above, the conductive layer may be a sidewall layer deposited along a sidewall surface. Any sidewall surface may be used. Examples include the sidewall surface of a trench, opening (such as a via), mesa or pillar. The sidewall surface may also be angled from the substrate and/or angled from the memory material. The conductive layer may be a substantially vertically disposed layer which is formed in other ways besides with the use of conformal deposition. The conductive layer may be in the form of a conductive spacer or a conductive liner. The conductive layer may be cupped shaped. The conductive layer need not actually contact the memory material. Also, it is possible that there me one or more intermediate layers between the memory material and the conductive layer.

In the memory devices discussed above, the electrical contacts deliver electrical current to the memory material. As the electrical current passes through the electrical contacts and through the memory material, at least a portion of the electric potential energy of the electrons is transferred to the surrounding material as heat. That is, the electrical energy is converted to heat energy via Joule heating. The amount of electrical energy converted to heat energy (that is, the amount of Joule heating) increases with the resistivity of the electrical contact (and memory material) as well as with the current density passing through the electrical contact and the memory material.

Figure 8:
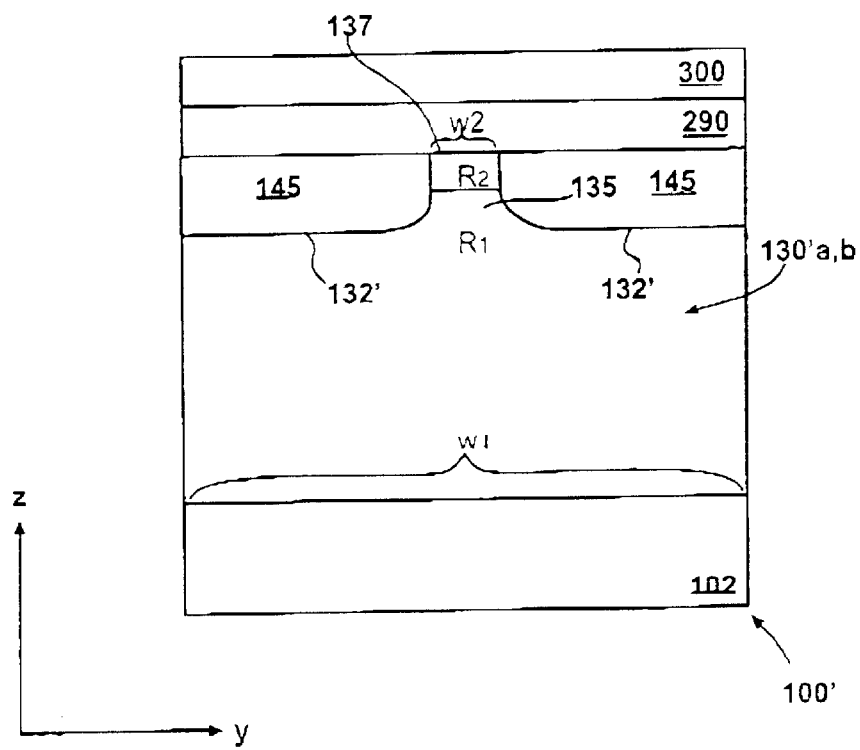
FIG. 8 is an example of an electrical contact having an increased resistivity in a region adjacent to the memory material.

To increase the amount of heat energy transferred into the memory material, it may be possible to increase the resistivity of the top surface or tip of the raised portion or protrusion that extends from the edge of the electrical contact. An example of this type of structure is shown in FIG. 8. FIG. 8 shows the conductive layer 130'A,B from FIG. 1C where the protrusion 135 has a region R2 (adjacent the memory material) which has a higher resistivity than the region R1 remote to the memory material. Examples of how to make an electrical contact having at least two different regions of material (that is, materials having different resistivities) are provided in U.S. patent application Ser. No. 09/620,318, the disclosure of which is incorporated by reference herein.

The memory elements of the present invention may be electrically coupled to isolation/selection devices and to addressing lines in order to form a memory array. The isolation/addressing devices permit each discrete memory cell to be read and written to without interfering with information stored in adjacent or remote memory cells of the array. Generally, the present invention is not limited to the use of any specific type of isolation/addressing device. Examples of isolation/addressing devices include field-effect transistors, bipolar junction transistors, and diodes. Examples of field-effect transistors include JFET and MOSFET. Examples of MOSFET include NMOS transistors and PMOS transistors. Furthermore NMOS and PMOS may even be formed on the same chip for CMOS technologies.

Hence, associated with each memory element of a memory array structure is isolation/addressing device which serves as an isolation/addressing device for that memory element thereby enabling that cell to be read and written without interfering with information stored in other adjacent or remote memory elements of the array.

The memory element of the present invention comprises a volume of memory material. Generally, the volume of memory material is a programmable resistance memory material which is programmable to at least a first resistance state and a second resistance state. The memory material is preferably programmed in response to electrical signals. Preferably, the electrical signals used to program the materials are electrical currents which are directed to the memory material.

In one embodiment, the memory material is programmable to two resistance states so that each of the memory elements is capable of storing a single bit of information. In another embodiment, the memory material is programmable to at least three resistance states so that each of the memory elements is capable of storing more than one bit of information. In yet another embodiment, the memory material is programmable to at least four resistance states so that each of the memory elements is capable of storing at least two bits of information. Hence, the memory materials may have a range of resistance values providing for the gray scale storage of multiple bits of information.

The memory materials may be directly overwritable so that they can be programmed from one resistance state to another without first having to be set to a starting state. Preferably, the same programming pulse or pulses may be used to program the memory material to a specific resistance state regardless of its previous resistance state. An example of a method of programming the memory element is provided in U.S. Pat. No. 6,075,719, the disclosure of which is incorporated by reference herein.

The memory material may be a phase change material. The phase-change materials may be any phase change memory material known in the art. Preferably, the phase change materials are capable of exhibiting a first order phase transition. Examples of materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

The phase change materials may be formed from a plurality of atomic elements. Preferably, the memory material includes at least one chalcogen element. The chalcogen element may be chosen from the group consisting of Te, Se, and mixtures or alloys thereof. The memory material may further include at least one element selected from the group consisting of Ge, Sb, Bi, Pb, Sn, As, S, Si, P, O, and mixtures or alloys thereof. In one embodiment, the memory material comprises the elements Te, Ge and Sb. In another embodiment, the memory material consists essentially of Te, Ge and Sb. An example of a memory material which may be used is $Te_2Ge_2Sb_5$.

The memory material may include at least one transition metal element. The term "transition metal" as used herein includes elements 21 to 30, 39 to 48, 57 and 72 to 80. Preferably, the one or more transition metal elements are selected from the group consisting of Cr, Fe, Ni, Nb, Pd, Pt and mixtures or alloys thereof. The memory materials which include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

A first example of an elementally modified memory material is a phase-change memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te——Ge——Sb ternary system and c is between about 90% and about 99.99%. Preferably, the transition metal may include Cr, Fe, Ni, Nb, Pd, Pt and mixtures or alloys thereof.

A second example of an elementally modified memory material is a phase-change memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. Preferably, the transition metal may include Cr, Fe, Ni, Pd, Pt, Nb, and mixtures or alloys thereof.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. A method for making a programmable resistance element, comprising:
    providing a conductive material;
    forming a silylated photoresist sidewall spacer over a portion of said conductive material;
    removing a portion of said conductive material to form a raised portion extending from said conductive material under said spacer; and
    forming a programmable resistance material adjacent to at least a portion of said raised portion.
2. The method of claim 1, wherein said removing step comprises etching said conductive material.
3. The method of claim 2, wherein said etching step comprises anisotropically etching said material.
4. The method of claim 2, wherein said etching step comprises isotropically etching said material.
5. The method of claim 1, wherein said forming said silylated spacer comprises:
    forming a photoresist mask over said conductive material;
    silylating said photoresist mask to form a top silylated portion and a sidewall silylated portion;
    removing said top silylated portion; and
    removing said photoresist mask whereby said silylated sidewall portion remains.
6. The method of claim 5, wherein said forming said photoresist mask step comprises:
    forming a photoresist layer over said conductive material; and
    removing a portion of said photoresist layer.
7. The method of claim 1, wherein said forming said programmable resistance material step comprises the step of forming said programmable resistance material adjacent to at least a portion of a tip portion of said raised portion.
8. The method of claim 1, wherein said programmable resistance material comprises a phase change material.
9. The method of claim 1, wherein said programmable resistance material comprises a chalcogen element.
10. A method for making a programmable resistance element, comprising:
    providing a conductive layer;
    forming a silylated photoresist sidewall spacer over a portion of an edge of said conductive layer;
    removing a portion of said conductive layer to form a raised portion extending from said edge under said spacer; and
    forming a programmable resistance material adjacent to at least a portion of said raised portion.
11. The method of claim 10, wherein said removing step comprises etching said conductive layer.
12. The method of claim 11, wherein said etching step comprises anisotropically etching said conductive layer.
13. The method of claim 11, wherein said etching step comprises isotropically etching said conductive layer.
14. The method of claim 10, wherein said forming said silylated spacer comprises:
    forming a photoresist mask over said edge;
    silylating said photoresist mask to form a top silylated portion and a sidewall silylated portion;
    removing said top silylated portion; and
    removing said photoresist mask whereby said silylated sidewall portion remains.
15. The method of claim 14, wherein said forming said photoresist mask step comprises:
    applying a photoresist layer over said edge; and
    removing a portion of said photoresist layer.
16. The method of claim 10, wherein said providing said conductive layer step comprises:
    providing a dielectric layer;
    forming a sidewall surface in said dielectric layer; and
    forming said conductive layer on said sidewall surface.
17. The method of claim 10, wherein said conductive material is a conductive sidewall spacer or a conductive sidewall liner.
18. The method of claim 10, wherein said forming said programmable resistance material step comprises the step of forming said programmable resistance material adjacent at least a portion of a tip of said raised portion.
19. The method of claim 10, wherein said programmable resistance material comprises a phase change material.
20. The method of claim 10, wherein said programmable resistance material comprises a chalcogen element.
21. A method of forming a programmable resistance memory element, comprising:
    providing a first dielectric layer;
    forming a sidewall surface in said first dielectric layer;
    forming a conductive layer on said sidewall surface;
    forming a second dielectric layer over said conductive layer;
    forming or exposing an edge of said conductive layer;
    forming a silylated photoresist sidewall spacer over a portion of said edge of said conductive layer;
    forming a raised portion extending from said edge of said conductive layer; and
    forming a programmable resistance memory material adjacent to at least a portion of said raised portion.
22. The method of claim 21, wherein said forming said raised portion step comprises:
    forming a silylated photoresist sidewall spacer over a portion of said edge of said conductive layer; and
    removing a portion of said conductive layer to form said raised portion under said spacer.
23. The method of claim 22, wherein said removing step comprises etching said conductive layer.
24. The method of claim 23, wherein said etching step comprises anisotropically etching said conductive layer.
25. The method of claim 23, wherein said etching step comprises isotropically etching said conductive layer.
26. The method of claim 22, wherein said forming said silylated spacer comprises:
    forming a photoresist mask over said edge;
    silylating said photoresist mask to form a top silylated portion and a sidewall silylated portion;
    removing said top silylated portion; and
    removing said photoresist mask whereby said silylated sidewall portion remains.

27. The method of claim 26, wherein said forming said photoresist mask step comprises:
   applying a photoresist layer over said edge; and
   removing a portion of said photoresist layer.

28. The method of claim 21, wherein said forming said programmable resistance material step comprises the steps of:
   forming a third dielectric layer on said edge and over said raised portion;
   removing a portion of said third dielectric layer to expose a top surface of said raised portion; and
   forming said programmable resistance material over at least a portion of said top surface.

29. The method of claim 21, wherein said forming said sidewall surface step comprises forming an opening in said first dielectric layer, said opening having said sidewall surface.

30. The method of claim 29, wherein forming said conductive layer on said sidewall surface step comprises forming said conductive layer on said sidewall surface and a bottom surface of said opening.

31. The method of claim 21, further comprising:
   after said forming said conductive layer step and before said forming said second dielectric layer step, removing a portion of said conductive layer.

32. The method of claim 21, wherein said removing said conductive layer step comprises anisotropically etching said conductive layer.

33. The method of claim 21, wherein said programmable resistance material comprises a phase change material.

34. The method of claim 21, wherein said programmable resistance material comprises a chalcogenide.

* * * * *

UNITED STATES PATENT AND TRADEMARK OFFICE
CERTIFICATE OF CORRECTION

PATENT NO. : 6,589,714 B2
DATED : July 8, 2003
INVENTOR(S) : Jon Maimon and Andrew Pomerene It is certified that error appears in the above-identified patent and that said Letters Patent is hereby corrected as shown below:

<u>Column 1,</u>
Line 3, add -- GOVERNMENT RIGHTS
This invention was made with the United States Government support under contract SC-0344-00-002 awarded by ARFL/VSSE. The United States Government has certain rights in this invention. --

Signed and Sealed this

Third Day of August, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,589,714 B2
APPLICATION NO. : 09/891551
DATED : July 8, 2003
INVENTOR(S) : Jon Maimon and Andrew Pomerene It is certified that error appears in the above-identified patent and that said Letters Patent is hereby corrected as shown below:

In the Specification

Column 1, Line 3, "contract SC-0344-00-002 awarded by ARFL/VSSE" should be changed to --Prime Contract No. F29601-00-D-0244/DO 0002 awarded by the U.S. Air Force--

Signed and Sealed this
Thirtieth Day of September, 2014

Michelle K. Lee
*Deputy Director of the United States Patent and Trademark Office*